US012740292B2

(12) United States Patent
Hanari

(10) Patent No.: US 12,740,292 B2
(45) Date of Patent: Sep. 15, 2026

(54) DISPLAY DEVICE HAVING A DAM STRUCTURE WITH PROTRUSIONS IN A SURROUNDING AREA AND MANUFACTURING METHOD THEREOF

(71) Applicant: Magnolia White Corporation, Tokyo (JP)

(72) Inventor: Jun Hanari, Tokyo (JP)

(73) Assignee: MAGNOLIA WHITE CORPORATION, Tokyo (JP)

(*) Notice: Subject to any disclaimer, the term of this patent is extended or adjusted under 35 U.S.C. 154(b) by 316 days.

(21) Appl. No.: 18/358,041

(22) Filed: Jul. 25, 2023

(65) Prior Publication Data

US 2024/0040905 A1 Feb. 1, 2024

(30) Foreign Application Priority Data

Jul. 26, 2022 (JP) ................................ 2022-118818

(51) Int. Cl.

| | |
|---|---|
| ***H10K 59/80*** | (2023.01) |
| ***H10K 59/12*** | (2023.01) |
| ***H10K 59/122*** | (2023.01) |

(52) U.S. Cl.

CPC ....... *H10K 59/873* (2023.02); *H10K 59/1201* (2023.02); *H10K 59/122* (2023.02)

(58) Field of Classification Search

CPC ............ H10K 59/873; H10K 59/1201; H10K 59/122; H10K 59/8722; H10K 59/872; H10K 71/00; H01L 27/3276; H01L 27/323; H01L 27/3246; H01L 51/5284; H01L 51/5253; G06F 3/0412

See application file for complete search history.

(56) References Cited

U.S. PATENT DOCUMENTS

| | | | | |
|---|---|---|---|---|
| 6,597,427 | B1 * | 7/2003 | Katsu | G02F 1/136259 349/54 |
| 7,023,234 | B2 * | 4/2006 | Tomita | G09G 3/006 324/760.02 |
| 8,508,123 | B2 * | 8/2013 | Nakamura | G02F 1/1309 345/55 |

(Continued)

FOREIGN PATENT DOCUMENTS

| | | |
|---|---|---|
| JP | 2000-195677 A | 7/2000 |
| JP | 2004-207217 A | 7/2004 |

(Continued)

OTHER PUBLICATIONS

Office Action issued Jul. 7, 2026, in JP Application No. 2022-118818, 6pp.

*Primary Examiner* — Caleb E Henry
(74) *Attorney, Agent, or Firm* — XSENSUS LLP

(57) ABSTRACT

According to one embodiment, a display device includes a substrate, a lower electrode in a display area, a rib including an aperture, a partition on the rib, a thin film including an upper electrode and an organic layer, a first sealing layer covering the thin film and the partition, a second sealing layer on the first sealing layer, and a dam structure including protrusions provided in a surrounding area between an end portion of the substrate and the display area. An end portion of the thin film is located between the dam structure and the display area. The second sealing layer covers the end portion of the thin film and covers at least part of the dam structure.

11 Claims, 20 Drawing Sheets

(56) References Cited

U.S. PATENT DOCUMENTS 9,287,329 B1 * 3/2016 Lee ...................... H10K 59/131
10,629,600 B2 * 4/2020 Kim ..................... H10B 12/318
10,678,368 B2 * 6/2020 Gwon ................... G06F 3/0412
10,971,571 B2 * 4/2021 Won ..................... H10K 59/131
11,600,686 B2 * 3/2023 Won ...................... G06F 3/0443
2004/0160170 A1 8/2004 Sato et al.
2005/0237211 A1 * 10/2005 Sato ..................... G09G 3/3283 362/559
2006/0157766 A1 * 7/2006 Won ....................... H10D 1/692 257/E21.59
2009/0009069 A1 1/2009 Takata
2010/0020029 A1 * 1/2010 Park ...................... G06F 3/0412 345/173
2013/0113734 A1 * 5/2013 Cho ........................ G06F 3/041 345/173
2016/0351093 A1 * 12/2016 Kim ..................... H10K 59/131
2017/0154945 A1 * 6/2017 Shin ..................... G09G 3/3266
2017/0294500 A1 * 10/2017 Song .................... H10K 59/123
2018/0032189 A1 * 2/2018 Lee ...................... G09G 3/3233
2018/0033830 A1 * 2/2018 Kim ..................... H10K 59/873
2018/0033831 A1 * 2/2018 An ......................... H10K 59/87
2018/0090702 A1 * 3/2018 Um ...................... H10K 77/111
2018/0113545 A1 * 4/2018 Shim ..................... G06F 3/0412
2018/0226454 A1 * 8/2018 Liu ...................... H10K 59/122
2018/0226610 A1 * 8/2018 Moon .................. H10K 59/124
2018/0348937 A1 * 12/2018 Pak ....................... G06F 3/0446
2018/0366520 A1 * 12/2018 Gwon ................ H10K 59/8731
2018/0373372 A1 * 12/2018 Kim ...................... G06F 3/0445
2019/0004653 A1 * 1/2019 Won ....................... H10K 59/40
2019/0004654 A1 * 1/2019 Gwon .................. H10K 59/131
2019/0006431 A1 * 1/2019 Won ...................... G06F 3/0443
2019/0036063 A1 * 1/2019 Lee ........................ H10K 59/40
2019/0129550 A1 * 5/2019 Jang ...................... G06F 3/0445
2019/0131379 A1 * 5/2019 Won ...................... G06F 3/0443
2019/0131572 A1 * 5/2019 Gwon ................... G06F 3/0412
2019/0187850 A1 * 6/2019 Kim ...................... G06F 1/1643
2019/0302934 A1 * 10/2019 Rhe ......................... G06F 3/047
2019/0302943 A1 * 10/2019 Rhe ......................... G06F 3/047
2019/0302944 A1 * 10/2019 Rhe ....................... G06F 3/0445
2019/0310731 A1 * 10/2019 Rhe ......................... G06F 3/047
2019/0339818 A1 * 11/2019 Rhe ....................... G06F 3/0443
2019/0363275 A1 11/2019 Ochi et al.
2020/0026383 A1 * 1/2020 Hwang ............... G06F 3/04184
2020/0026385 A1 * 1/2020 Lee ....................... G06F 3/0416
2020/0026408 A1 * 1/2020 Lee ..................... G06F 3/04184
2020/0167038 A1 * 5/2020 Lee ....................... G06F 3/0443
2020/0212346 A1 * 7/2020 Lee ...................... H10K 59/122
2021/0134910 A1 * 5/2021 Yang .................... H10D 86/441
2021/0193787 A1 * 6/2021 Won .................... G06F 3/04164
2021/0280827 A1 * 9/2021 Oh ..................... H10K 85/6565
2022/0077251 A1 3/2022 Choung et al.
2022/0256719 A1 * 8/2022 Jang ...................... G06F 1/1652

FOREIGN PATENT DOCUMENTS

JP 2008-135325 A 6/2008
JP 2009-32673 A 2/2009
JP 2010-118191 A 5/2010
JP 2012182121 A 9/2012
JP 2018200787 A 12/2018
WO 2018/179308 A1 10/2018

* cited by examiner

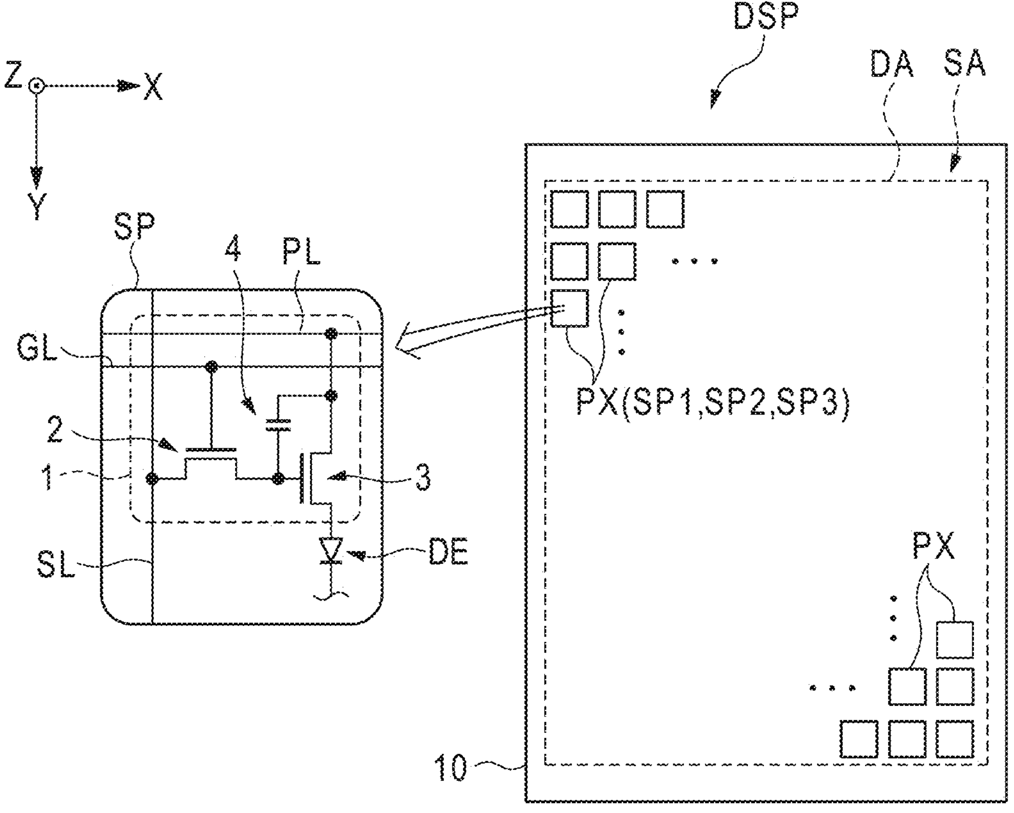
F I G. 1

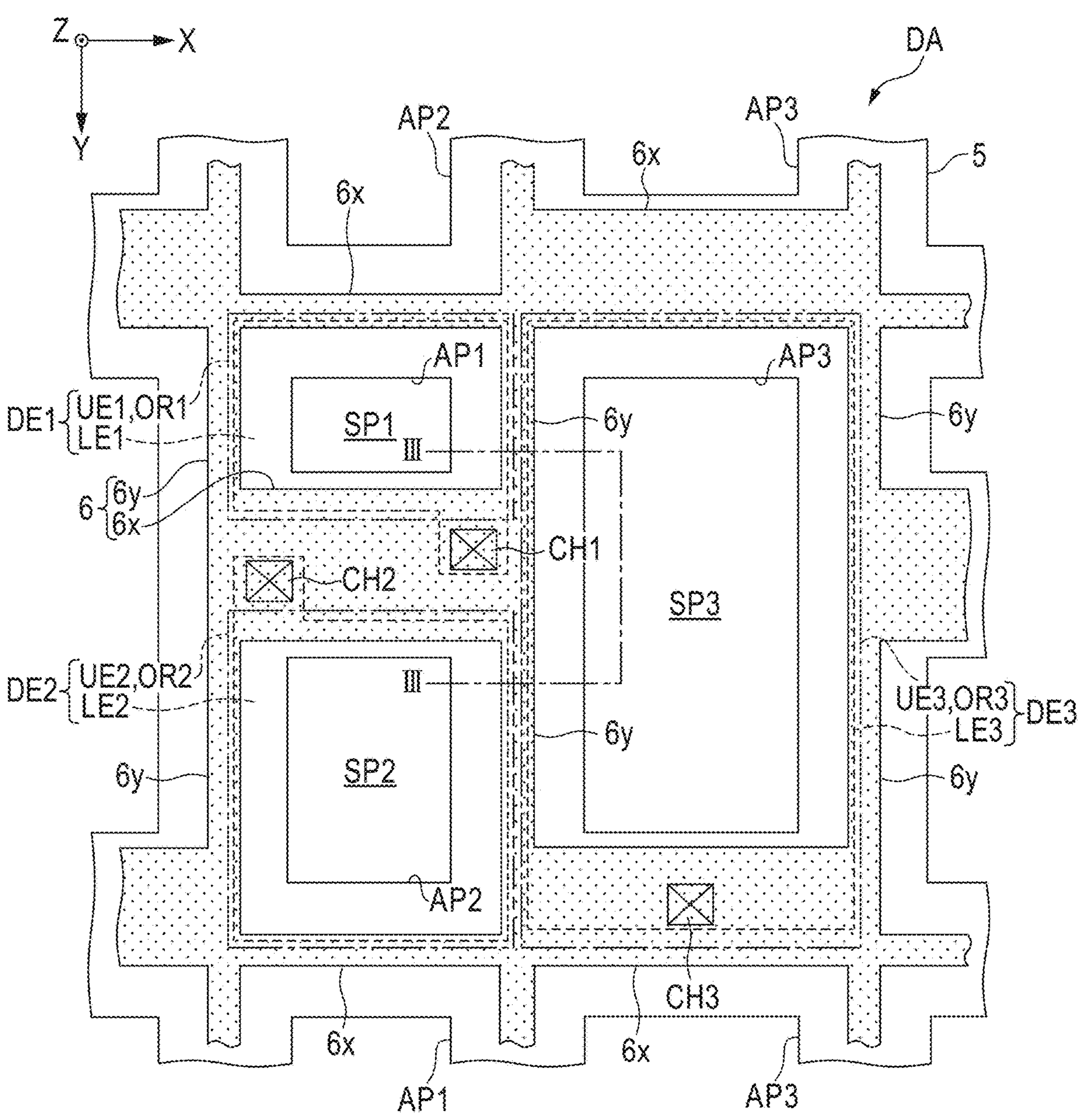
F I G. 2

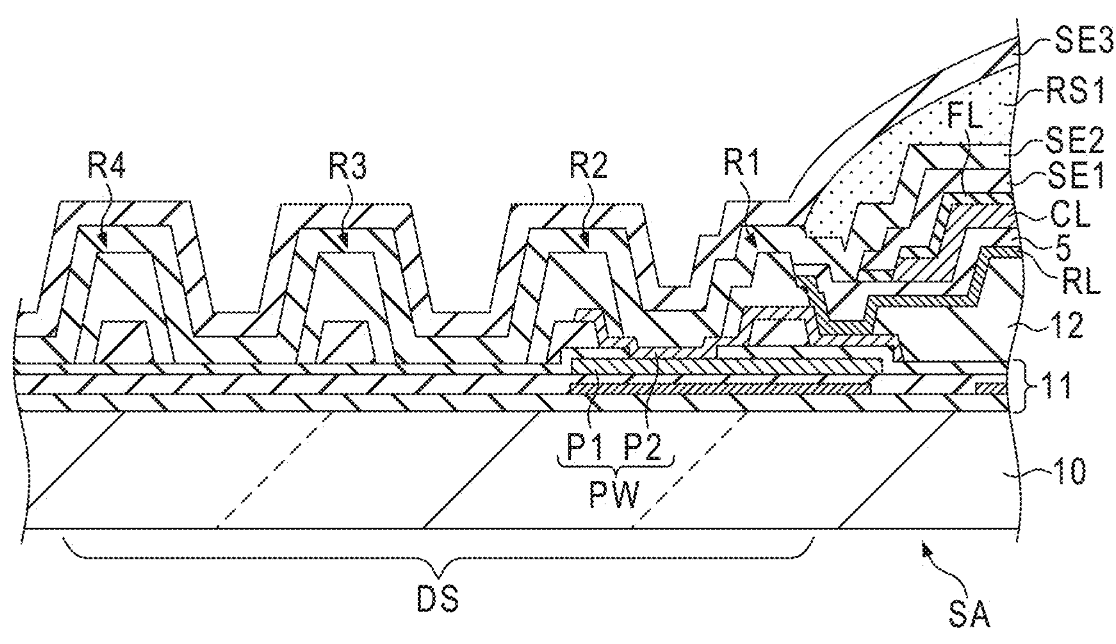
F I G. 13
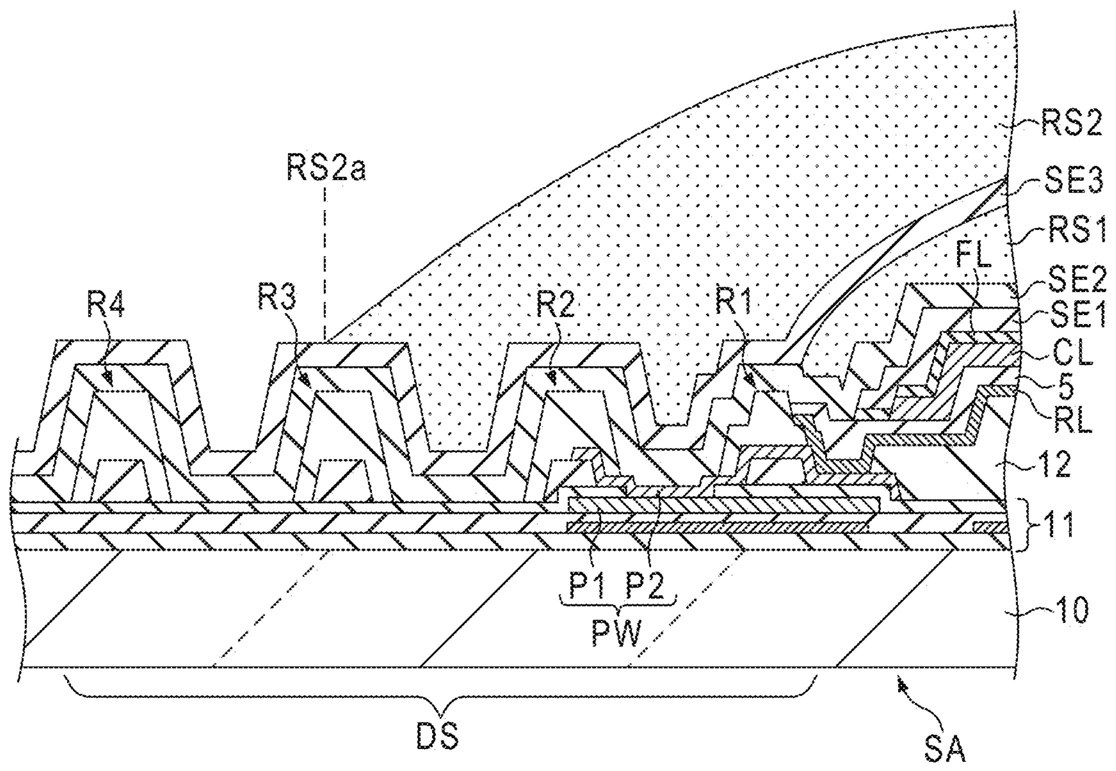
F I G. 14

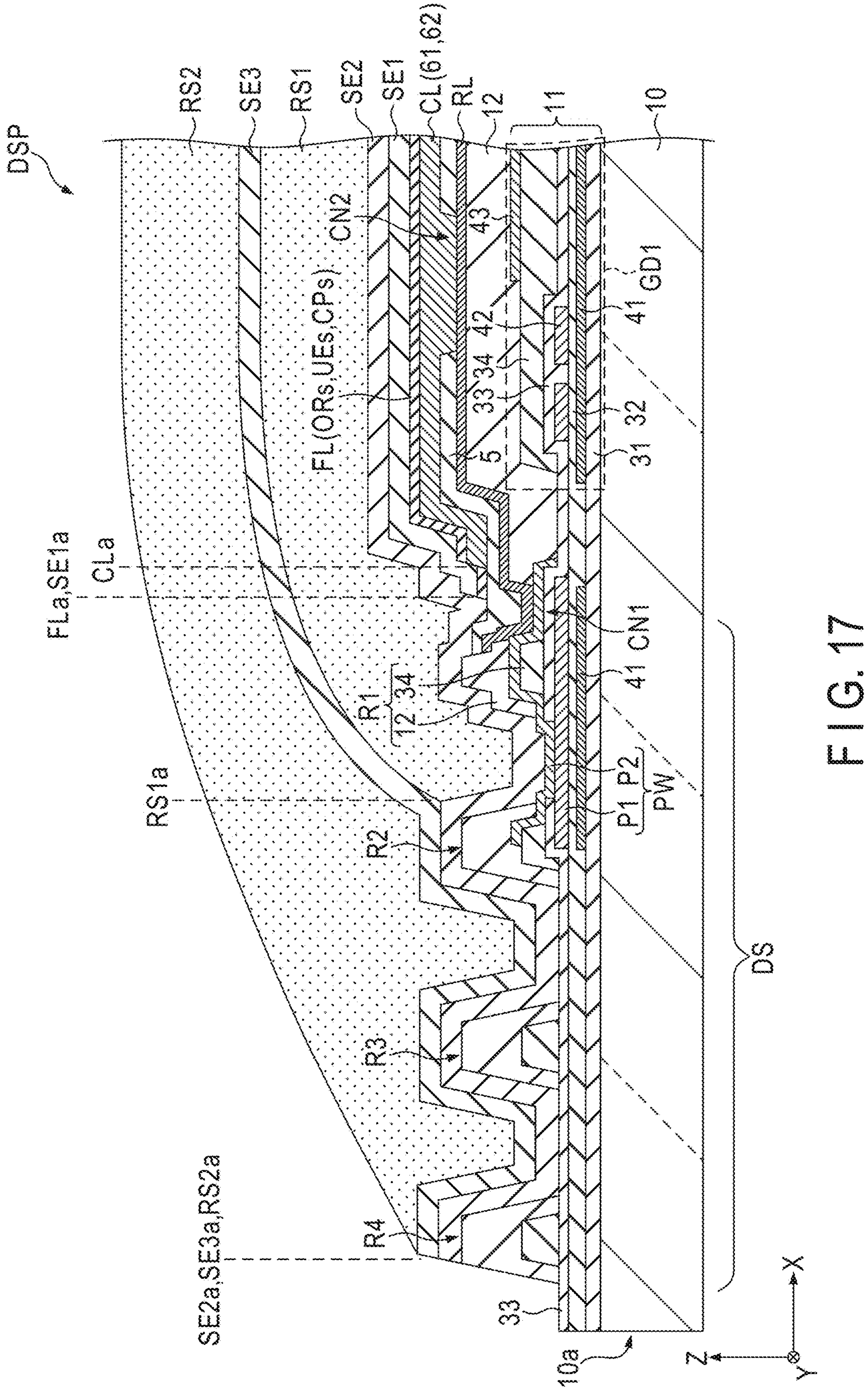
F I G. 17

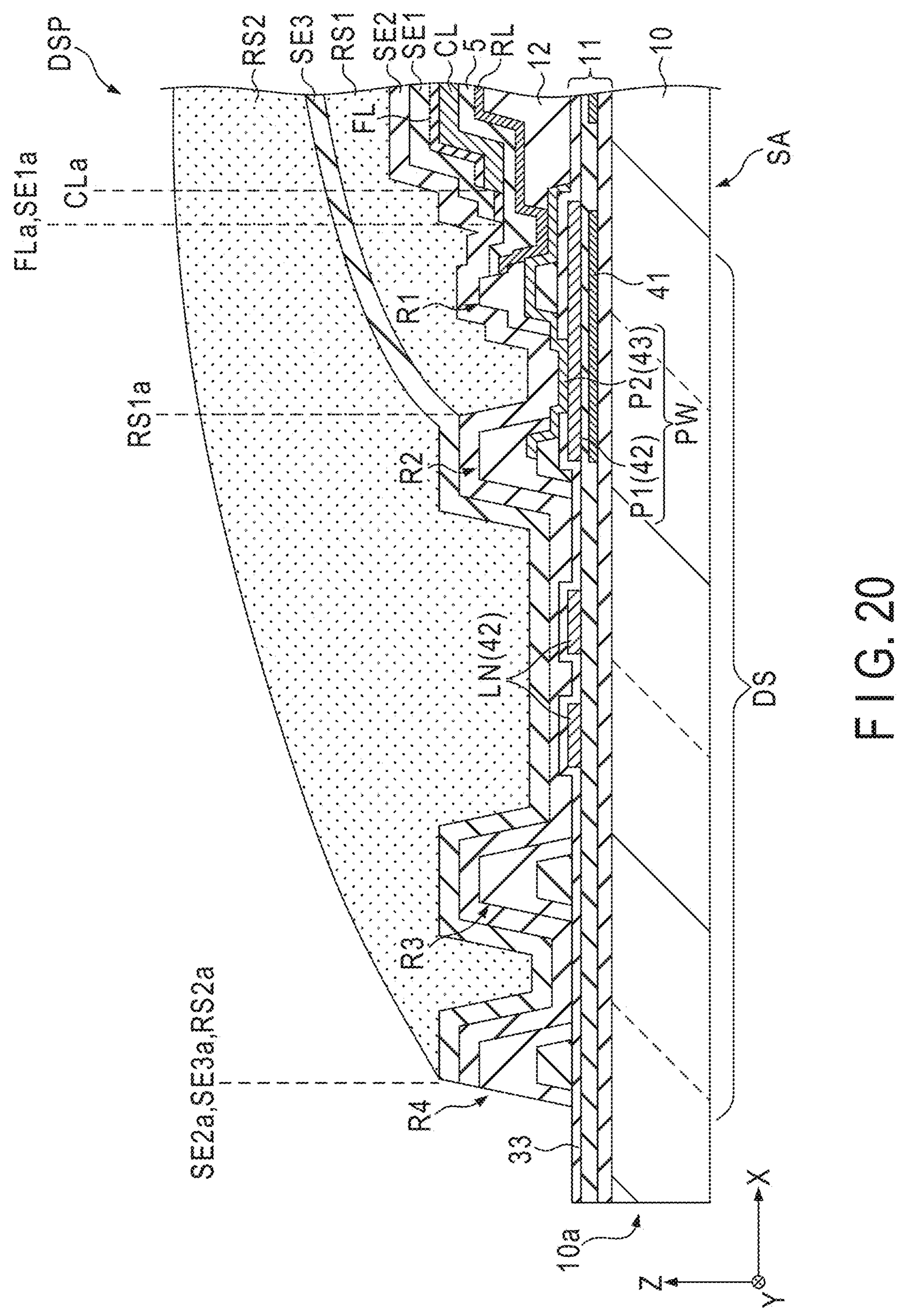
F I G. 20

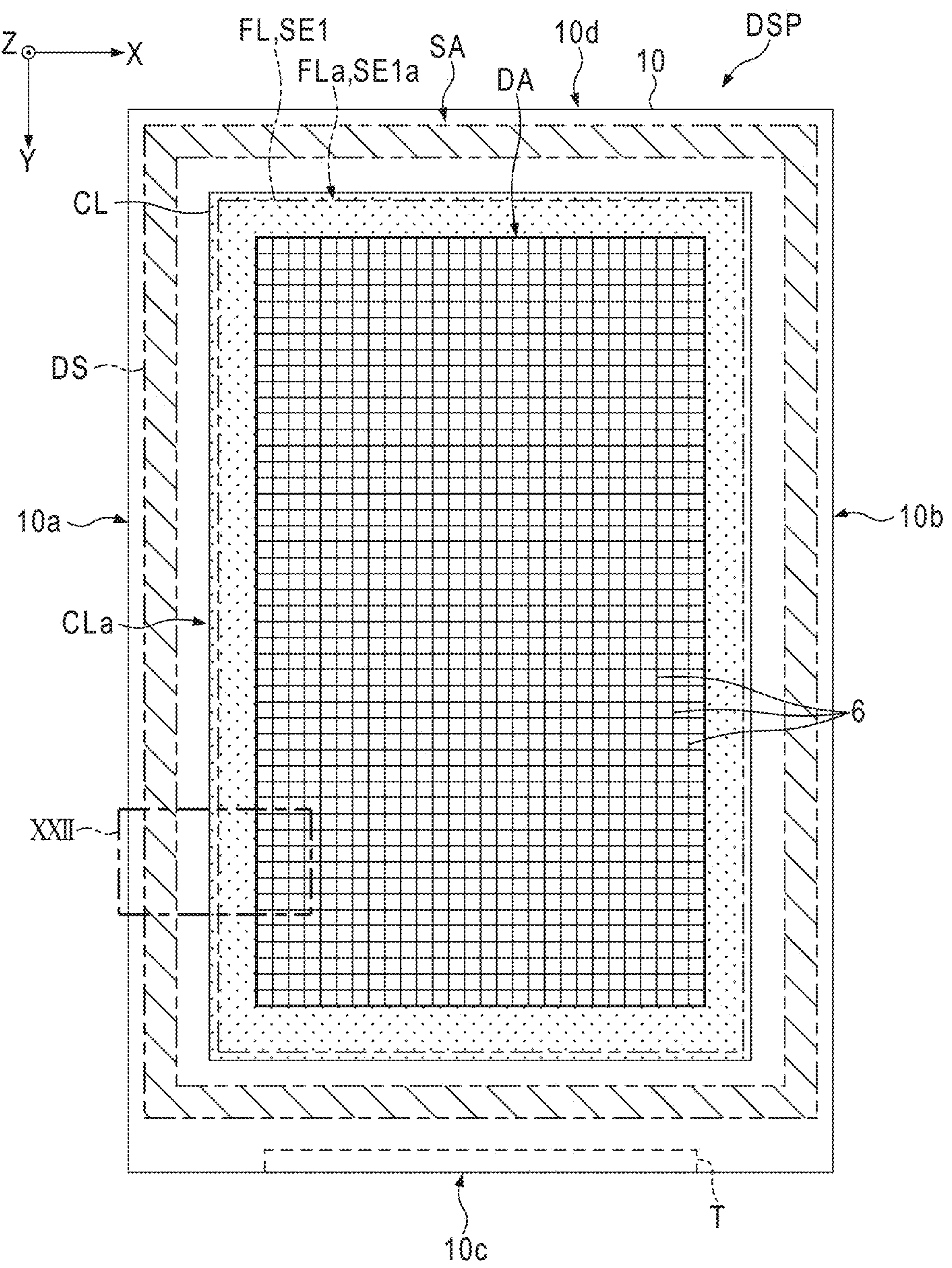
F I G. 21

DISPLAY DEVICE HAVING A DAM STRUCTURE WITH PROTRUSIONS IN A SURROUNDING AREA AND MANUFACTURING METHOD THEREOF

CROSS-REFERENCE TO RELATED APPLICATIONS

This application is based upon and claims the benefit of priority from Japanese Patent Application No. 2022-118818, filed Jul. 26, 2022, the entire contents of which are incorporated herein by reference.

FIELD

Embodiments described herein relate generally to a display device and a manufacturing method thereof.

BACKGROUND

Recently, display devices to which an organic light emitting diode (OLED) is applied as a display element have been put into practical use. This display element comprises a lower electrode, an organic layer which covers the lower electrode, and an upper electrode which covers the organic layer.

When such a display device is manufactured, a technique which improves reliability is required.

BRIEF DESCRIPTION OF THE DRAWINGS

FIG. 1 is a diagram showing a configuration example of a display device according to a first embodiment.

FIG. 2 is a diagram showing an example of the layout of subpixels.

FIG. 13 is a schematic cross-sectional view showing a manufacturing process following FIG. 12.

FIG. 14 is a schematic cross-sectional view showing a manufacturing process following FIG. 13.

FIG. 17 is a schematic cross-sectional view showing a second modified example which could be applied to the display device according to the first embodiment.

FIG. 20 is a schematic cross-sectional view showing a second modified example which could be applied to the display device according to the second embodiment.

FIG. 21 is a schematic plan view of a display device according to a third embodiment.

DETAILED DESCRIPTION

Figure 3:
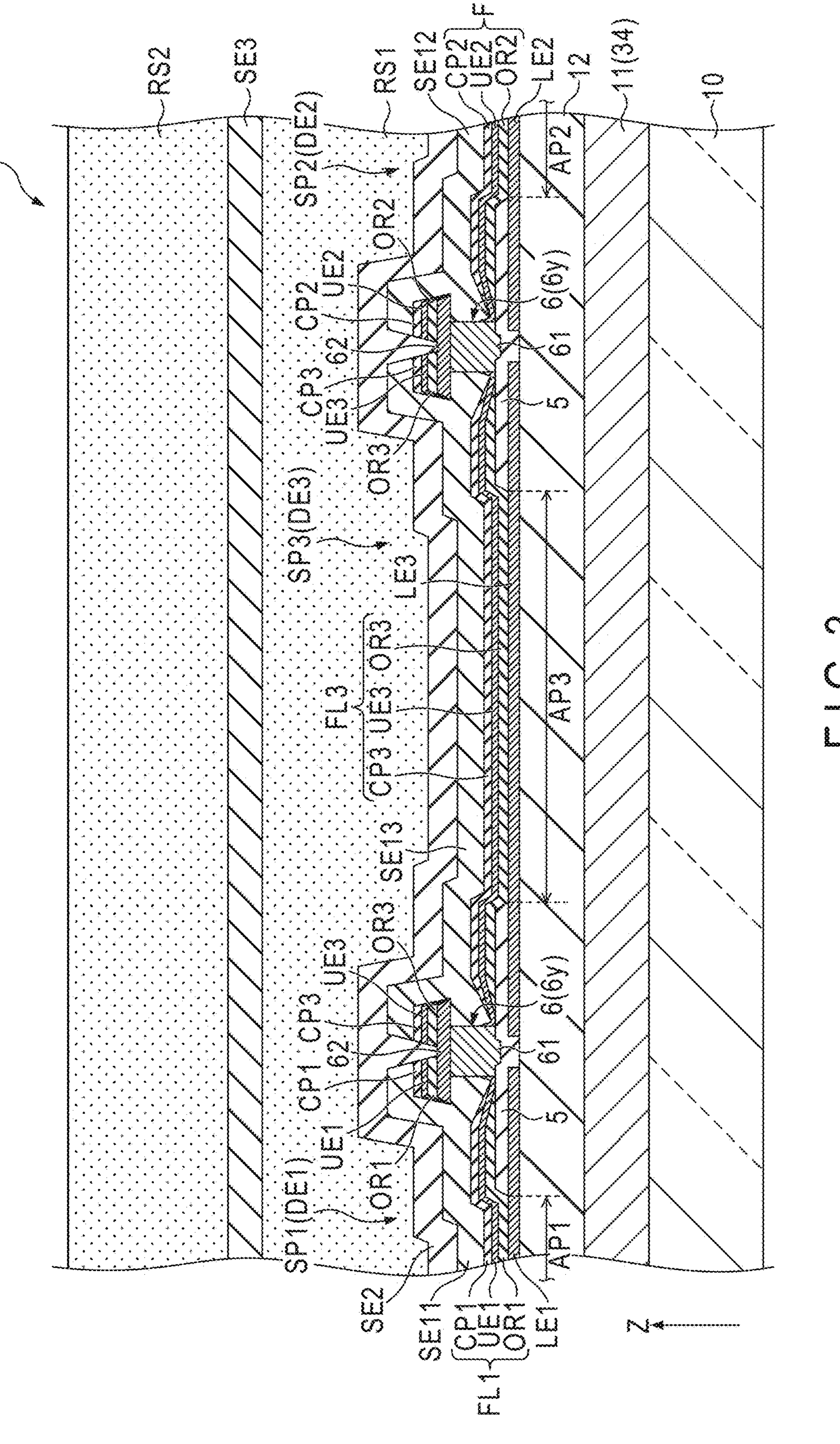
FIG. 3 is a schematic cross-sectional view of the display device along the III-III line of FIG. 2.

In general, according to one embodiment, a display device comprises a substrate, a lower electrode provided above the substrate in a display area including a pixel, a rib comprising an aperture overlapping the lower electrode, a partition provided on the rib in the display area, a thin film including an upper electrode which faces the lower electrode, and an organic layer which emits light based on a potential difference between the lower electrode and the upper electrode, a first sealing layer formed of an inorganic material and covering the thin film and the partition, a second sealing layer formed of an inorganic material and provided on the first sealing layer, and a dam structure including a plurality of protrusions provided in a surrounding area between an end portion of the substrate and the display area. The thin film is provided in the display area and the surrounding area. An end portion of the thin film in the surrounding area is located between the dam structure and the display area. The second sealing layer covers the end portion of the thin film and covers at least part of the dam structure.

According to another aspect of an embodiment, a display device comprises a substrate, a lower electrode provided above the substrate in a display area including a pixel, a rib comprising an aperture overlapping the lower electrode, a partition provided on the rib in the display area, a thin film including an upper electrode which faces the lower electrode, and an organic layer which emits light based on a potential difference between the lower electrode and the upper electrode, a first sealing layer formed of an inorganic material and covering the thin film and the partition, and a second sealing layer formed of an inorganic material and provided on the first sealing layer. The partition comprises a lower portion and an upper portion protruding from a side surface of the lower portion. Each of the thin film and the first sealing layer comprises an end portion located on the upper portion. The second sealing layer covers the end portions of the thin film and the first sealing layer.

According to yet another aspect of an embodiment, a manufacturing method of a display device comprises forming a dam structure including a plurality of protrusions in a surrounding area between an end portion of a substrate and a display area including a pixel, forming a lower electrode above the substrate in the display area, forming a rib comprising an aperture overlapping the lower electrode, forming a partition on the rib in the display area, forming a thin film including an upper electrode facing the lower electrode, and an organic layer which emits light based on a potential difference between the lower electrode and the upper electrode, and comprising an end portion located between the dam structure and the display area, forming a first sealing layer which covers the thin film and the partition by an inorganic material, and forming a second sealing layer which covers the first sealing layer, the end portion of the thin film and the dam structure by an inorganic material over the entire substrate.

The embodiments can improve the reliability of a display device.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction X. A direction parallel to the Y-axis is referred to as a second direction Y. A direction parallel to the Z-axis is referred to as a third direction Z. The third direction Z is a normal direction relative to a plane including the first direction X and the second direction Y. When various elements are viewed parallel to the plane including the first direction X and the second direction Y, the appearance is defined as a plan view.

When the position of an element located in the positive direction of the Z-axis relative to another element is referred to, the term "on" or "above" may be used. When the position of an element located on the opposite direction is referred to, the term "under" or "blow" may be used. When the positional relationship between two elements is defined using the terms "on", "above", "under", "below", "face", etc., the two elements may be directly in contact with each other, or may be spaced apart from each other as a gap or another element is interposed between them.

The display device of each embodiment is an organic electroluminescent display device comprising an organic light emitting diode (OLED) as a display element, and could be mounted on a television, a personal computer, a vehicle-mounted device, a tablet, a smartphone, a mobile phone, etc.

First Embodiment

FIG. 1 is a diagram showing a configuration example of a display device DSP according to a first embodiment. The display device DSP comprises a display area DA which displays an image and a surrounding area SA around the display area DA on an insulating substrate 10. The substrate 10 may be glass or a resinous film having flexibility.

In the present embodiment, the substrate 10 is rectangular as seen in plan view. It should be noted that the shape of the substrate 10 in plan view is not limited to a rectangular shape and may be another shape such as a square shape, a circular shape or an elliptic shape.

The display area DA comprises a plurality of pixels PX arrayed in matrix in a first direction X and a second direction Y. Each pixel PX includes a plurality of subpixels SP. For example, each pixel PX includes a red subpixel SP1, a green subpixel SP2 and a blue subpixel SP3. It should be noted that each pixel PX may include a subpixel SP which exhibits another color such as white in addition to subpixels SP1, SP2 and SP3 or instead of one of subpixels SP1, SP2 and SP3. Each pixel PX may consist of two subpixels SP or four or more subpixels SP.

Each subpixel SP comprises a pixel circuit 1 and a display element DE driven by the pixel circuit 1. The pixel circuit 1 comprises a pixel switch 2, a drive transistor 3 and a capacitor 4. The pixel switch 2 and the drive transistor 3 are, for example, switching elements consisting of thin-film transistors.

The gate electrode of the pixel switch 2 is connected to a scanning line GL. One of the source electrode and drain electrode of the pixel switch 2 is connected to a signal line SL. The other one is connected to the gate electrode of the drive transistor 3 and the capacitor 4. In the drive transistor 3, one of the source electrode and the drain electrode is connected to a power line PL and the capacitor 4, and the other one is connected to the display element DE.

The display element DE is an organic light emitting diode (OLED) as a light emitting element. For example, subpixel SP1 comprises a display element DE which emits light in a red wavelength range. Subpixel SP2 comprises a display element DE which emits light in a green wavelength range. Subpixel SP3 comprises a display element DE which emits light in a blue wavelength range.

It should be noted that the configuration of the pixel circuit 1 is not limited to the example shown in the figure. For example, the pixel circuit 1 may comprise more thin-film transistors and capacitors.

FIG. 2 is a diagram showing an example of the layout of subpixels SP1, SP2 and SP3. In the example of FIG. 2, subpixels SP1 and SP2 are arranged in the second direction Y. Further, each of subpixels SP1 and SP2 is adjacent to subpixel SP3 in the first direction X.

When subpixels SP1, SP2 and SP3 are provided in line with this layout, in the display area DA, a column in which subpixels SP1 and SP2 are alternately provided in the second direction Y and a column in which a plurality of subpixels SP3 are repeatedly provided in the second direction Y are formed. These columns are alternately arranged in the first direction X.

It should be noted that the layout of subpixels SP1, SP2 and SP3 is not limited to the example of FIG. 2. As another example, subpixels SP1, SP2 and SP3 in each pixel PX may be arranged in order in the first direction X.

A rib 5 and a partition 6 are provided in the display area DA. The rib 5 comprises pixel apertures AP1, AP2 and AP3 in subpixels SP1, SP2 and SP3, respectively. In the example of FIG. 2, the pixel aperture AP2 is larger than the pixel aperture AP1. The pixel aperture AP3 is larger than the pixel aperture AP2.

The partition 6 is provided in the boundary between adjacent subpixels SP and overlaps the rib 5 as seen in plan view. The partition 6 comprises a plurality of first partitions **6*x* extending in the first direction X and a plurality of second partitions 6*y* extending in the second direction Y. The first partitions 6*x* are provided between the pixel apertures AP1 and AP2 which are adjacent to each other in the second direction Y and between two pixel apertures AP3 which are adjacent to each other in the second direction Y. Each second partition 6*y* is provided between the pixel apertures AP1** and AP3 which are adjacent to each other in the first direction X and between the pixel apertures AP2 and AP3 which are adjacent to each other in the first direction X.

In the example of FIG. 2, the first partitions 6*x* and the second partitions 6*y* are connected to each other. In this configuration, the partition 6 has a grating shape surrounding the pixel apertures AP1, AP2 and AP3 as a whole. In other words, the partition 6 comprises apertures in subpixels SP1, SP2 and SP3 in a manner similar to that of the rib 5.

Subpixel SP1 comprises a lower electrode LE1, an upper electrode UE1 and an organic layer OR1 overlapping the pixel aperture AP1. Subpixel SP2 comprises a lower electrode LE2, an upper electrode UE2 and an organic layer OR2 overlapping the pixel aperture AP2. Subpixel SP3 comprises a lower electrode LE3, an upper electrode UE3 and an organic layer OR3 overlapping the pixel aperture AP3. In the example of FIG. 2, the outer shapes of the upper electrode UE1 and the organic layer OR1 are coincident with each other. The outer shapes of the upper electrode UE2 and the organic layer OR2 are coincident with each other. The outer shapes of the upper electrode UE3 and the organic layer OR3 are coincident with each other.

The lower electrode LE1, the upper electrode UE1 and the organic layer OR1 constitute the display element DE1 of subpixel SP1. The lower electrode LE2, the upper electrode UE2 and the organic layer OR2 constitute the display element DE2 of subpixel SP2. The lower electrode LE3, the upper electrode UE3 and the organic layer OR3 constitute the display element DE3 of subpixel SP3.

The lower electrode LE1 is connected to the pixel circuit 1 (see FIG. 1) of subpixel SP1 through a contact hole CH1. The lower electrode LE2 is connected to the pixel circuit 1 of subpixel SP2 through a contact hole CH2. The lower electrode LE3 is connected to the pixel circuit 1 of subpixel SP3 through a contact hole CH3.

In the example of FIG. 2, the contact holes CH1 and CH2 entirely overlap the first partition 6X between the pixel apertures AP1 and AP2 which are adjacent to each other in the second direction Y. The contact hole CH3 entirely overlaps the first partition 6*x* between two pixel apertures AP3 which are adjacent to each other in the second direction Y. As another example, at least part of the contact hole CH1, CH2 or CH3 may not overlap the first partition 6*x*.

FIG. 3 is a schematic cross-sectional view of the display device DSP along the III-III line of FIG. 2. A circuit layer 11 is provided on the substrate 10 described above. The circuit layer 11 includes various circuits and lines such as the pixel circuit 1, scanning line GL, signal line SL and power line PL shown in FIG. 1. As described in detail later, the circuit layer 11 also includes a first organic insulating layer 34 (see FIG. 8).

The circuit layer 11 is covered with a second organic insulating layer 12. The second organic insulating layer 12 functions as a planarization film which planarizes the irregularities formed by the circuit layer 11. Although not shown in the section of FIG. 3, the contact holes CH1, CH2 and CH3 described above are provided in the second organic insulating layer 12.

The lower electrodes LE1, LE2 and LE3 are provided on the second organic insulating layer 12. The rib 5 is provided on the second organic insulating layer 12 and the lower electrodes LE1, LE2 and LE3. The end portions of the lower electrodes LE1, LE2 and LE3 are covered with the rib 5.

The partition 6 includes a conductive lower portion 61 provided on the rib 5 and an upper portion 62 provided on the lower portion 61. The upper portion 62 has a width greater than that of the lower portion 61. By this configuration, in FIG. 3, the both end portions of the upper portion 62 protrude relative to the side surfaces of the lower portion 61. This shape of the partition 6 may be called an overhang shape.

The organic layer OR1 covers the lower electrode LE1 through the pixel aperture AP1. The upper electrode UE1 covers the organic layer OR1 and faces the lower electrode LE1. The organic layer OR2 covers the lower electrode LE2 through the pixel aperture AP2. The upper electrode UE2 covers the organic layer OR2 and faces the lower electrode LE2. The organic layer OR3 covers the lower electrode LE3 through the pixel aperture AP3. The upper electrode UE3 covers the organic layer OR3 and faces the lower electrode LE3. At least parts of the upper electrodes UE1, UE2 and UE3 are in contact with the lower portion 61, respectively.

In the example of FIG. 3, a cap layer CP1 is provided above the organic layer OR1. A cap layer CP2 is provided above the organic layer OR2. A cap layer CP3 is provided above the organic layer OR3. The cap layers CP1, CP2 and CP3 adjust the optical property of the light emitted from the organic layers OR1, OR2 and OR3, respectively.

The organic layer OR1, the upper electrode UE1 and the cap layer CP1 are partly located on the upper portion 62. These portions are spaced apart from the other portions of the organic layer OR1, the upper electrode UE1 and the cap layer CP1. Similarly, the organic layer OR2, the upper electrode UE2 and the cap layer CP2 are partly located on the upper portion 62, and these portions are spaced apart from the other portions of the organic layer OR2, the upper electrode UE2 and the cap layer CP2. Further, the organic layer OR3, the upper electrode UE3 and the cap layer CP3 are partly located on the upper portion 62, and these portions are spaced apart from the other portions of the organic layer OR3, the upper electrode UE3 and the cap layer CP3.

In the following explanation, a stacked layer body including the organic layer OR1, the upper electrode UE1 and the cap layer CP1 may be called a thin film FL1. A stacked layer body including the organic layer OR2, the upper electrode UE2 and the cap layer CP2 may be called a thin film FL2. A stacked layer body including the organic layer OR3, the upper electrode UE3 and the cap layer CP3 may be called a thin film FL3.

First sealing layers SE11, SE12 and SE13 are provided in subpixels SP1, SP2 and SP3, respectively. The first sealing layer SE11 continuously covers the cap layer CP1 and the partition 6 around subpixel SP1. The first sealing layer SE12 continuously covers the cap layer CP2 and the partition 6 around subpixel SP2. The first sealing layer SE13 continuously covers the cap layer CP3 and the partition 6 around subpixel SP3.

In the example of FIG. 3, the organic layer OR1, the upper electrode UE1, the cap layer CP1 and the first sealing layer SE11 on the partition 6 between subpixels SP1 and SP3 are spaced apart from the organic layer OR3, the upper electrode UE3, the cap layer CP3 and the first sealing layer SE13 on this partition 6. The organic layer OR2, the upper electrode UE2, the cap layer CP2 and the first sealing layer SE12 on the partition 6 between subpixels SP2 and SP3 are spaced apart from the organic layer OR3, the upper electrode UE3, the cap layer CP3 and the first sealing layer SE13 on this partition 6.

The first sealing layers SE11, SE12 and SE13 are covered with a second sealing layer SE2. The second sealing layer SE2 is covered with a first resin layer RS1. The first resin layer RS1 is covered with a third sealing layer SE3. Further, the third sealing layer SE3 is covered with a second resin layer RS2. The second sealing layer SE2, the third sealing layer SE3, the first resin layer RS1 and the second resin layer RS2 are continuously provided at least in the entire display area DA and partly extend to the surrounding area SA.

The display device DSP may further comprise an optical element such as a polarizer provided on the second resin layer RS2 and cover glass. The optical element and the cover glass are attached to the second resin layer RS2 by, for example, a transparent adhesive material.

Each of the first organic insulating layer 34 and the second organic insulating layer 12 is formed of an organic insulating material. Each of the rib 5, the first sealing layers SE11, SE12 and SE13, the second sealing layer SE2 and the third sealing layer SE3 is formed of, for example, an inorganic material such as silicon nitride (SiNx). Each of the rib 5, the first sealing layers SE11, SE12 and SE13, the second sealing layer SE2 and the third sealing layer SE3 may be formed of silicon oxide (SiOx) or silicon oxynitride (SiON) or may be a stacked layer body consisting of at least two of a silicon nitride layer, a silicon oxide layer and a silicon oxynitride layer. Each of the first resin layer RS1 and the second resin layer RS2 is formed of a resinous material (organic insulating material) such as acrylic resin.

Each of the lower electrodes LE1, LE2 and LE3 comprises an intermediate layer formed of, for example, silver (Ag), and a pair of conductive oxide layers covering the upper and lower surfaces of the intermediate layer. Each conductive oxide layer may be formed of, for example, a transparent conductive oxide such as indium tin oxide (ITO), indium zinc oxide (IZO) or indium gallium zinc oxide (IGZO).

Each of the upper electrodes UE1, UE2 and UE3 is formed of, for example, a metal material such as an alloy of magnesium and silver (MgAg). For example, the lower electrodes LE1, LE2 and LE3 correspond to anodes, and the upper electrodes UE1, UE2 and UE3 correspond to cathodes.

For example, each of the organic layers OR1, OR2 and OR3 comprises a multilayer structure consisting of a hole injection layer, a hole transport layer, an electron blocking layer, a light emitting layer, a hole blocking layer, an electron transport layer and an electron injection layer. Each of the organic layers OR1, OR2 and OR3 may comprise a tandem structure including a plurality of light emitting layers. It should be noted that, in the organic layers OR1, OR2 and OR3, at least one of the functional layers shown here may be omitted, or another functional layer may be added.

Each of the cap layers CP1, CP2 and CP3 is formed of, for example, a multilayer body consisting of a plurality of transparent thin films. As the thin films, the multilayer body may include a thin film formed of an inorganic material and a thin film formed of an organic material. These thin films have refractive indices different from each other. The materials of the thin films constituting the multilayer body are different from the materials of the upper electrodes UE1, UE2 and UE3 and are also different from the materials of the first sealing layers SE11, SE12 and SE13. It should be noted that at least one of the cap layers CP1, CP2 and CP3 may be omitted.

The lower portion 61 of the partition 6 is formed of, for example, aluminum (Al). The lower portion 61 may be formed of an aluminum alloy such as an aluminum-neodymium alloy (AlNd) or may comprise a multilayer structure consisting of an aluminum layer and an aluminum alloy layer. Further, the lower portion 61 may comprise a thin film formed of a metal material different from aluminum and an aluminum alloy under the aluminum layer or the aluminum alloy layer. This thin film can be formed of, for example, molybdenum (Mo).

For example, the upper portion 62 of the partition 6 comprises a multilayer structure consisting of a thin film formed of a metal material such as titanium (Ti) and a thin film formed of conductive oxide such as ITO. The upper portion 62 may comprise a single-layer structure formed of a metal material such as titanium. The upper portion 62 may comprise a single-layer structure formed of an inorganic material different from the first sealing layers SE11, SE12 and SE13.

Common voltage is applied to the partition 6. This common voltage is applied to each of the upper electrodes UE1, UE2 and UE3 which are in contact with the side surfaces of the lower portions 61. Pixel voltage is applied to the lower electrodes LE1, LE2 and LE3 through the pixel circuits 1 provided in subpixels SP1, SP2 and SP3, respectively.

When a potential difference is formed between the lower electrode LE1 and the upper electrode UE1, the light emitting layer of the organic layer OR1 emits light in a red wavelength range. When a potential difference is formed between the lower electrode LE2 and the upper electrode UE2, the light emitting layer of the organic layer OR2 emits light in a green wavelength range. When a potential difference is formed between the lower electrode LE3 and the upper electrode UE3, the light emitting layer of the organic layer OR3 emits light in a blue wavelength range.

Figure 4:
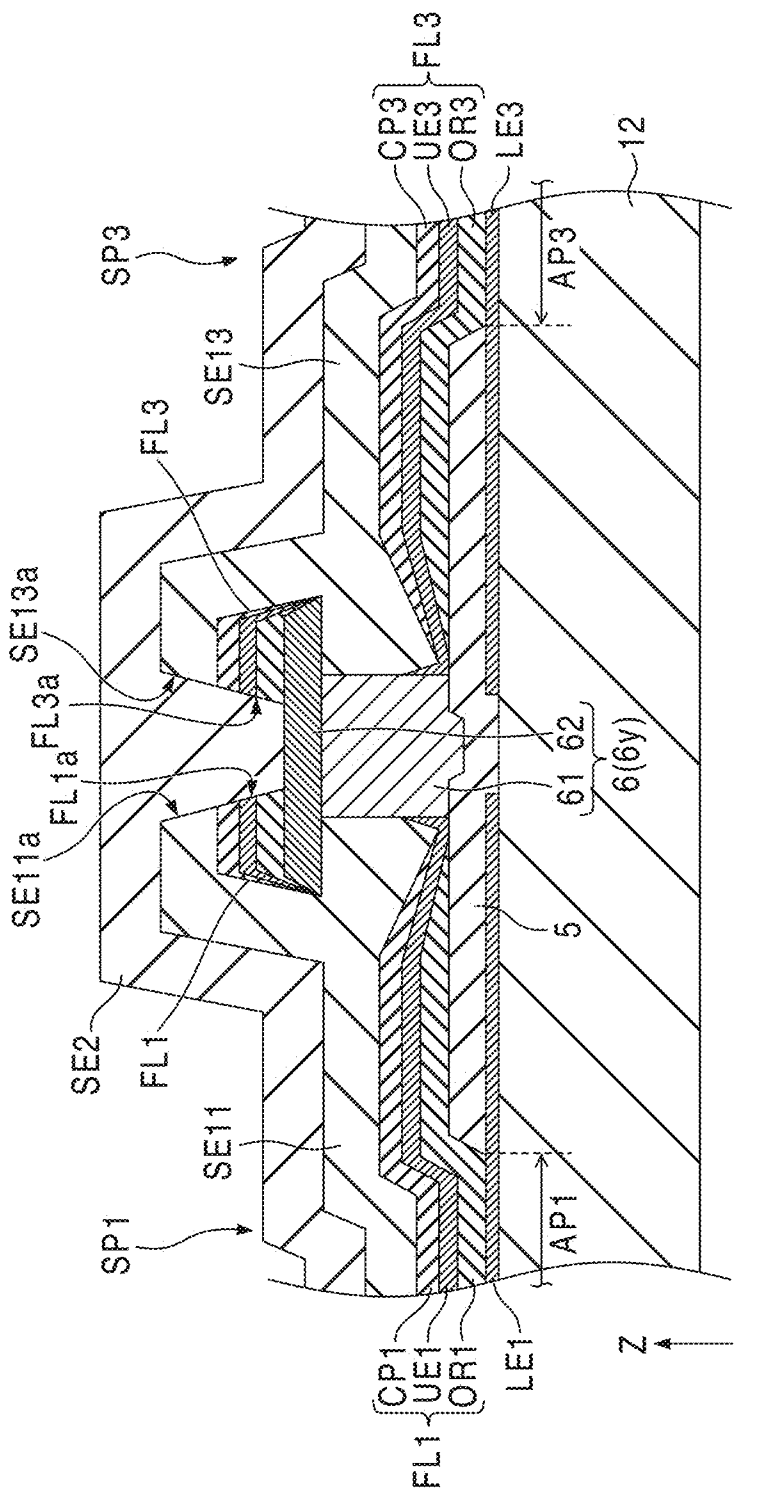
FIG. 4 is a schematic cross-sectional view in which a partition and its vicinity are enlarged.

FIG. 4 is a schematic cross-sectional view in which the partition 6 provided in the boundary between subpixels SP1 and SP3 and its vicinity are enlarged. In this figure, the substrate 10, the circuit layer 11, the first resin layer RS1, the third sealing layer SE3 and the second resin layer RS2 are omitted.

The organic layer OR1, the upper electrode UE1 and the cap layer CP1 are formed by vapor deposition and are patterned together with the first sealing layer SE11. An end portion FL1*a* of the thin film FL1 including the organic layer OR1, the upper electrode UE1 and the cap layer CP1 is located on the upper portion 62. An end portion SE11*a* of the first sealing layer SE11 is also located on the upper portion 62. The end portion FL1*a* is not covered with the first sealing layer SE11.

Similarly, the organic layer OR3, the upper electrode UE3 and the cap layer CP3 are formed by vapor deposition and are patterned together with the first sealing layer SE13. An end portion FL3*a* of the thin film FL3 including the organic layer OR3, the upper electrode UE3 and the cap layer CP3 is located on the upper portion 62. An end portion SE13*a* of the first sealing layer SE13 is also located on the upper portion 62. The end portion FL3*a* is not covered with the first sealing layer SE13.

The end portion FL1*a* and the end portion FL3*a* are spaced apart from each other across an intervening gap. The end portion SE11*a* and the end portion SE13*a* are spaced apart from each other across an intervening gap. The second sealing layer SE2 is continuously provided in the entire display area DA and covers the end portions FL1*a*, FL3*a*, SE11*a* and SE13*a*. Further, the gap between the end portion FL1*a* and the end portion FL3*a* and the gap between the end portion SE11*a* and the end portion SE13*a* are filled with the second sealing layer SE2. The second sealing layer SE2 is in contact with the upper portion 62.

It should be noted that the configuration of the partition 6 between subpixels SP1 and SP2 and its vicinity and the configuration of the partition 6 between subpixels SP2 and SP3 and its vicinity are similar to the configuration of the example of FIG. 4.

Now, this specification explains a structure which could be applied to the surrounding area SA.

Figure 5:
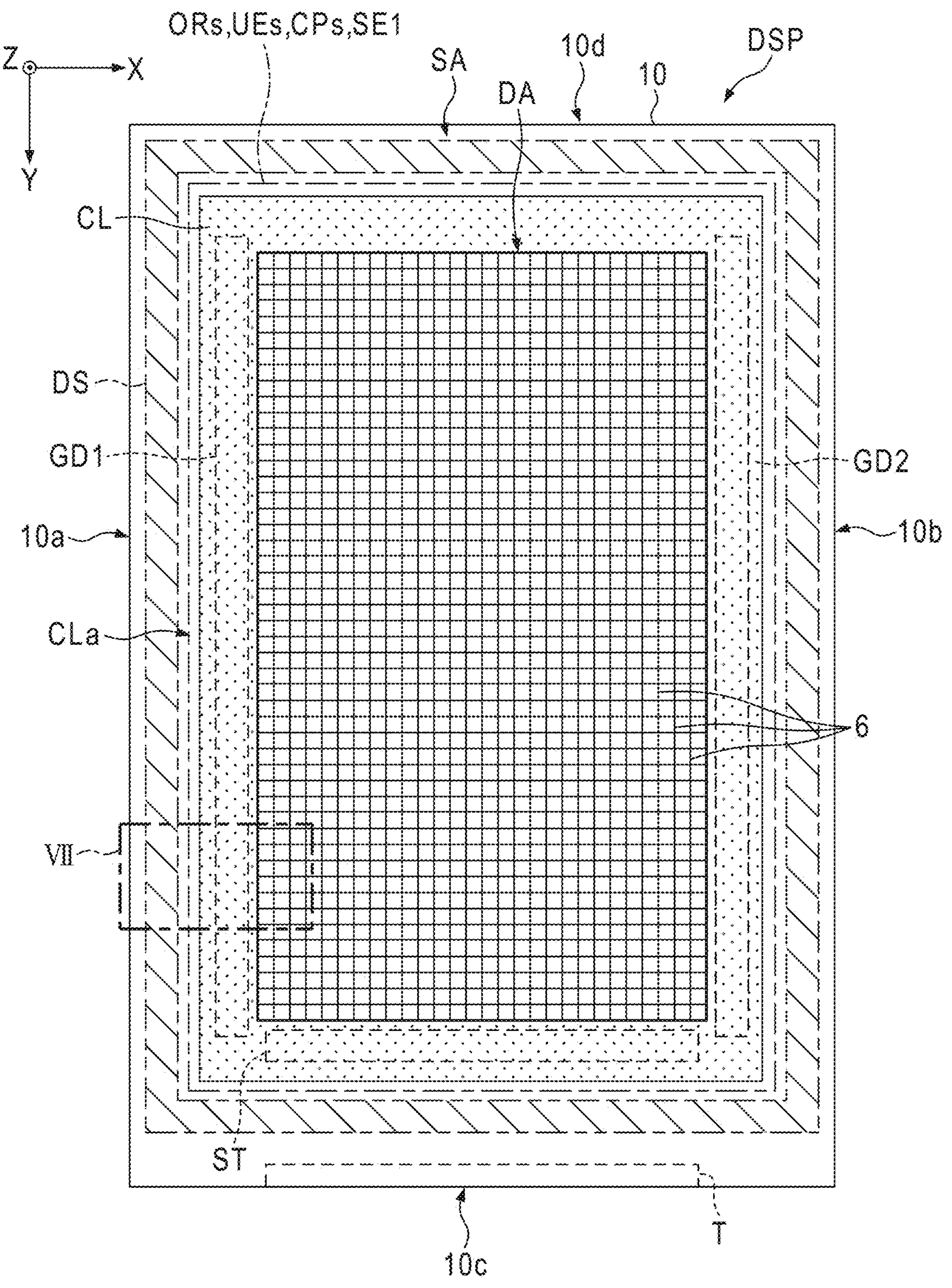
FIG. 5 is a schematic plan view of the display device according to the first embodiment.

FIG. 5 is a schematic plan view of the display device DSP. The display device DSP comprises, as elements provided in the surrounding area SA, a first gate drive circuit GD1, a second gate drive circuit GD2, a selector circuit ST and a terminal portion T. The first gate drive circuit GD1, the second gate drive circuit GD2 and the selector circuit ST are examples of drive circuits which supply a signal to the pixel circuits 1, and are included in the circuit layer 11 shown in FIG. 3.

The first gate drive circuit GD1 and the second gate drive circuit GD2 supply a scanning signal to the scanning lines G shown in FIG. 1. For example, a flexible printed circuit is connected to the terminal portion T. The selector circuit ST supplies a video signal input from the flexible printed circuit to the signal lines SL shown in FIG. 1.

The substrate 10 comprises end portions 10*a*, 10*c* and 10*d*. The end portions 10*a* and 10*b* extend parallel to the second direction Y. The end portions 10*c* and 10*d* extend parallel to the first direction X.

In the example of FIG. 5, the first gate drive circuit GD1 is provided between the display area DA and the end portion 10*a*. The second gate drive circuit GD2 is provided between the display area DA and the end portion 10*b*. The selector circuit ST and the terminal portion T are provided between the display area DA and the end portion 10*c*.

Further, the display device DSP comprises a conductive layer CL (dotted portion) and a dam structure DS (hatched portion) in the surrounding area SA. In the example of FIG. 5, the conductive layer CL surrounds the display area DA. The dam structure DS surrounds the display area DA and the conductive layer CL. The conductive layer CL and the dam structure DS may partially overlap each other. For example, the dam structure DS functions to dam up the first resin layer RS1 and second resin layer RS2 shown in FIG. 3. This function will be explained later with reference to FIG. 8.

The conductive layer CL is connected to the partition 6 provided in the display area DA. The conductive layer CL overlaps the first gate drive circuit GD1, the second gate drive circuit GD2 and the selector circuit ST as seen in plan view.

It should be noted that the conductive layer CL may not necessarily have a shape surrounding the display area DA. For example, the conductive layer CL may not be provided between the display area DA and the end portion 10*c* or between the display area DA and the end portion 10*d*.

An organic layer ORs, an upper electrode UEs, a cap layer CPs and a first sealing layer SE1 are provided in the surrounding area SA. The organic layer ORs is formed of the same material by the same process as one of the organic layers OR1, OR2 and OR3. The upper electrode UEs is formed of the same material by the same process as one of the upper electrodes UE1, UE2 and UE3. The cap layer CPs is formed of the same material by the same process as one of the cap layers CP1, CP2 and CP3. The first sealing layer SE1 is formed of the same material by the same process as one of the sealing layers SE11, SE12 and SE13. For example, the organic layer ORs, the upper electrode UEs, the cap layer CPs and the first sealing layer SE1 are formed of the same material by the same process as the organic layer OR1, the upper electrode UE1, the cap layer CP1 and the first sealing layer SE11, respectively.

In the example of FIG. 5, the organic layer ORs, the upper electrode UEs, the cap layer CPs and the first sealing layer SE1 overlap the conductive layer CL as seen in plan view. To the contrary, none of the organic layer ORs, the upper electrode UEs, the cap layer CPs and the first sealing layer SE1 overlaps the dam structure DS as seen in plan view.

Figure 6:
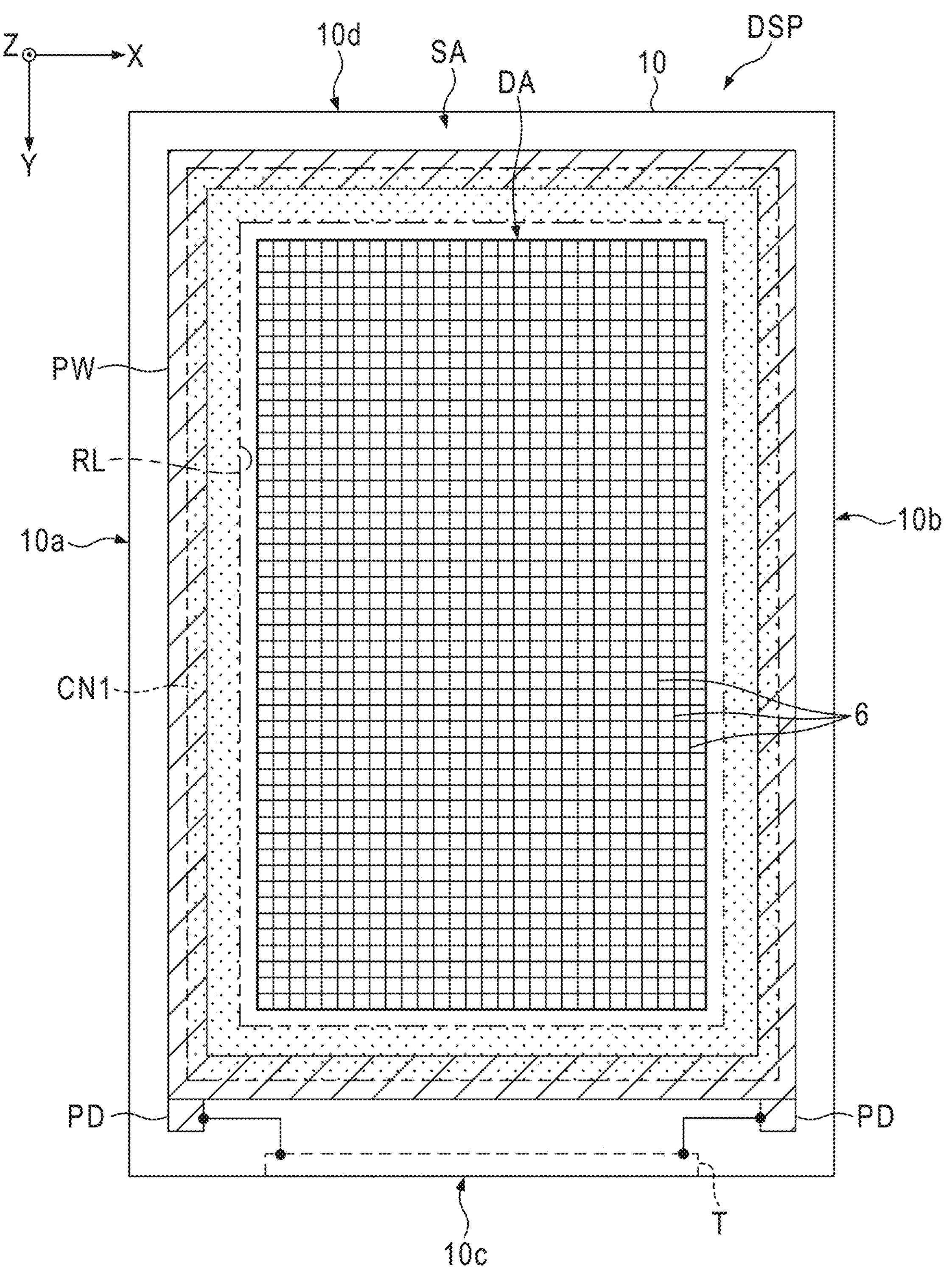
FIG. 6 is a schematic plan view showing other elements of the display device according to the first embodiment.

FIG. 6 is a schematic plan view showing other elements provided in the surrounding area SA. A feed line PW (hatched portion) and a relay line (RL) (dotted portion) are provided in the surrounding area SA.

In FIG. 6, the feed line PW and the relay line RL surround the display area DA. However, the configuration is not limited to this example. The feed line PW and the relay line RL partially overlap each other.

The feed line PW comprises a pair of pads PD located near the end portion 10*c*. These pads PD are electrically connected to the terminal portion T. Common voltage is applied to the feed line PW through the terminal portion T and each pad PD. Further, the common voltage of the feed line PW is applied to the relay line RL.

Figure 7:
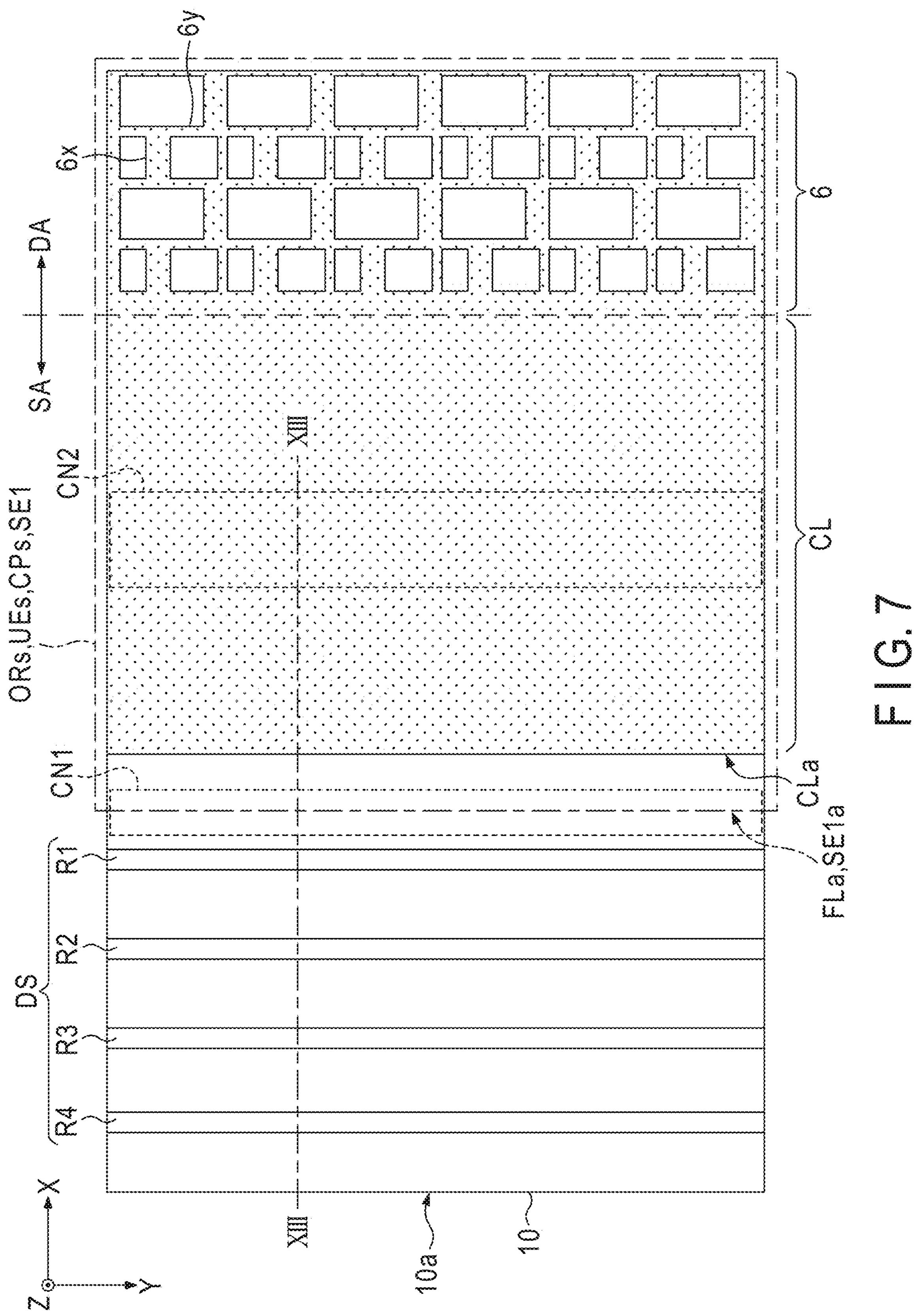
FIG. 7 is an enlarged view of the area surrounded by the chained frame VII in FIG. 5.
Figure 8:
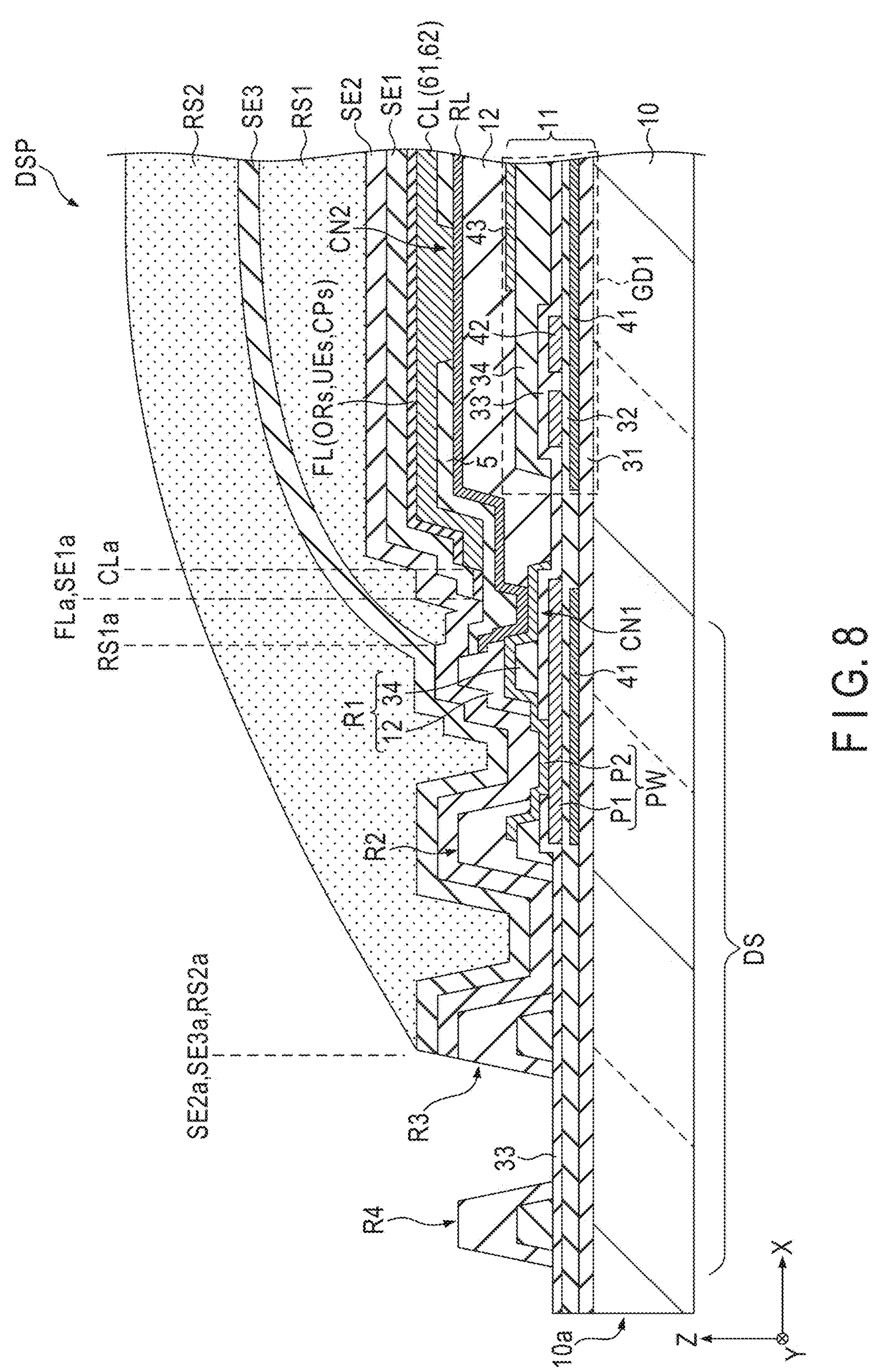
FIG. 8 is a schematic cross-sectional view of the display device along the XIII-XIII line of FIG. 7.

FIG. 7 is an enlarged view of the area surrounded by the chained frame VII in FIG. 5. FIG. 8 is a schematic cross-sectional view of the display device DSP along the XIII-XIII line of FIG. 7. In FIG. 7, the dotted area corresponds to the conductive layer CL and the partition 6 (the first partitions 6*x* and the second partitions 6*y*). The conductive layer CL and the partition 6 are integrally formed of the same material by the same manufacturing process.

As shown in FIG. 7 and FIG. 8, the dam structure DS comprises a plurality of protrusions R1, R2, R3 and R4. For example, each of the protrusions R1, R2, R3 and R4 has a frame shape formed along the planar shape of the dam structure DS shown in FIG. 5. In other words, the protrusion R1 surrounds the display area DA. The protrusion R2 surrounds the protrusion R1. The protrusion R3 surrounds the protrusion R2. The protrusion R4 surrounds the protrusion R3. It should be noted that the number of protrusions provided in the dam structure DS is not limited to four, and may be three or less, or five or more.

For example, the distance between two adjacent protrusions of the protrusions R1, R2, R3 and R4 is greater than the width of each of the protrusions R1, R2, R3 and R4. For example, the width of each of the protrusions R1, R2, R3 and R4 is 15 to 25 μm. The distance between two adjacent protrusions of the protrusions R1, R2, R3 and R4 is 25 to 35 μm. The height of each of the protrusions R1, R2, R3 and R4 is 3 to 4 μm.

In the example of FIG. 8, the circuit layer 11 comprises inorganic insulating layers 31, 32 and 33, the first organic insulating layer 34 described above, and metal layers 41, 42 and 43. The inorganic insulating layer 31 covers the substrate 10. The metal layer 41 is provided on the inorganic insulating layer 31 and is covered with the inorganic insulating layer 32. The metal layer 42 is provided on the inorganic insulating layer 32 and is covered with the inorganic insulating layer 33. The first organic insulating layer 34 is provided on the inorganic insulating layer 33. The metal layer 43 is provided on the first organic insulating layer 34 and is covered with the second organic insulating layer 12.

Each of the inorganic insulating layers 31, 32 and 33 is formed of, for example, an inorganic material such as silicon nitride or silicon oxide. For example, each of the metal layers 41, 42 and 43 comprises a single-layer structure of a metal material such as molybdenum (Mo), tungsten (W), molybdenum tungsten alloy (MoW), aluminum (Al) or copper (Cu), or a multilayer structure of these metal materials.

The first gate drive circuit GD1 consists of the metal layers 41, 42 and 43 and a semiconductor layer. Similarly, the second gate drive circuit GD2 and selector circuit ST shown in FIG. 5 and the pixel circuit 1 shown in FIG. 1 consist of the metal layers 41, 42 and 43 and a semiconductor layer. The scanning line GL shown in FIG. 1 consists of the metal layer 41. The signal line SL shown in FIG. 1 consists of the metal layer 42.

The protrusions R1, R2, R3 and R4 are provided on the inorganic insulating layer 33. The rib is also provided in the surrounding area SA. In the example of FIG. 8, the rib 5 is not provided in the dam structure DS.

In the example of FIG. 8, each of the protrusions R1, R2, R3 and R4 includes a portion formed of the first organic insulating layer 34 and a portion formed of the second organic insulating layer 12. The portion formed of the second organic insulating layer 12 covers the portion formed of the first organic insulating layer 34. When each of the protrusions R1, R2, R3 and R4 consists of two organic insulating layers in this manner, the heights of the protrusions R1, R2, R3 and R4 can be increased compared to a case where each of the protrusions consists of one organic insulating layer.

The conductive layer CL covers the rib 5 in the surrounding area SA. The conductive layer CL includes a lower portion 61 and an upper portion 62 in a manner similar to that of the partition 6 shown in FIG. 3 and FIG. 4.

As shown in FIG. 7 and FIG. 8, the conductive layer CL does not overlap the dam structure DS. An end portion CLa of the conductive layer CL is located between the protrusion R1 and the display area DA.

In the example of FIG. 8, the feed line PW comprises a first portion P1 formed of the metal layer 42 and a second portion P2 formed of the metal layer 43. The second portion P2 is in contact with the first portion P1. For example, of the feed line PW shown in FIG. 6, the pads PD are formed of the first portion P1, and the portion which surrounds the display area DA is formed of at least the second portion P2.

The first portion P1 is located below the first organic insulating layer 34 of the protrusion R1. The second portion P2 is located on the first organic insulating layer 34 of the protrusion R1 and is covered with the second organic insulating layer 12. In other words, in a third direction Z (the thickness direction of the substrate 10 or the normal direction with respect to the substrate 10), the first organic insulating layer 34 of the protrusion R1 is located between the first portion P1 and the second portion P2.

The relay line RL is largely provided on the second organic insulating layer 12 and is covered with the rib 5. For example, the relay line RL is formed of the same material by the same manufacturing process as the lower electrodes LE1, LE2 and LE3.

The relay line RL is connected to the feed line PW in a first contact portion CN1 and is connected to the conductive line CL in a second contact portion CN2. By this configuration, the common voltage of the feed line PW is applied to the conductive layer CL via the relay line RL. Further, the common voltage of the conductive layer CL is applied to the partition 6 and upper electrodes UE1, UE2 and UE3 of the display area DA.

The first contact portion CN1 is provided near the protrusion R1. In the first contact portion CN1, the relay line RL is in contact with the second portion P2 of the feed line PW. For example, the first contact portion CN1 corresponds to the area in which the feed line PW overlaps the relay line RL in the plan view of FIG. 6, and surrounds the display area DA. It should be noted that the first contact portion CN1 may be disconnected in at least one place around the display area DA.

As shown in FIG. 8, the rib 5 comprises an aperture in the second contact portion CN2. The conductive layer CL is in contact with the relay line RL through the aperture. The aperture of the rib 5 may range over the entire second contact portion CN2 shown in FIG. 7. The rib 5 may comprise a plurality of apertures dispersed in the second contact portion CN2.

As shown in FIG. 7, the second contact portion CN2 is located between the first contact portion CN1 and the display area DA in plan view. The end portion CLa of the conductive layer CL is located between the first contact portion CN1 and the second contact portion CN2 as seen in plan view.

In FIG. 7, the area in which the organic layer ORs, the upper electrode UEs, the cap layer CPs and the first sealing layer SE1 are provided is shown by chain lines. In FIG. 8, a stacked layer body including the organic layer ORs, the upper electrode UEs and the cap layer CPs is shown as a thin film FL. In practice, the upper electrode UEs covers the organic layer ORs, and the cap layer CPs covers the upper electrode UEs. The first sealing layer SE1 covers the thin film FL.

As shown in FIG. 8, the thin film FL covers the conductive layer CL. As shown in FIG. 7, the position of an end portion FLa of the thin film FL is substantially coincident with that of an end portion SE1*a* of the first sealing layer SE1 as seen in plan view. The end portions FLa and SE1*a* are located between the dam structure DS and the display area DA. The end portions FLa and SE1*a* are located between the end portion CLa of the conductive layer CL and the dam structure DS. For example, the end portions FLa and SE1*a* overlap the first contact portion CN1 as seen in plan view.

As shown in FIG. 8, the second sealing layer SE2, the third sealing layer SE3, the first resin layer RS1 and the second resin layer RS2 are formed in the surrounding area SA as well. The second sealing layer SE2 covers the end portion FLa of the thin film FL and the end portion SE1*a* of the first sealing layer SE1.

Further, the second sealing layer SE2 covers part of the dam structure DS. Specifically, in the example of FIG. 8, the second sealing layer SE2 covers the protrusions R1, R2 and R3 and does not cover the protrusion R4. An end portion SE2*a* of the second sealing layer SE2 is located on the protrusion R3. The second sealing layer SE2 is in contact with the second organic insulating layers 12 of the protrusions R1, R2 and R3, of the second portion P2 of the feed line PW, the portion located between the protrusions R1 and R2, and of the inorganic insulating layer 33, the portion located between the protrusions R2 and R3.

An end portion RS1*a* of the first resin layer RS1 is located at a position closer to the end portion of the substrate 10 than the end portion FLa of the thin film FL and the end portion SE1*a* of the first sealing layer SE1. In the example of FIG. 8, the end portion RS1*a* is located near the protrusion R1. The end portions FLa, SE1*a* and CLa overlap the first resin layer RS1 in the third direction Z (the thickness direction of the substrate 10 or the normal direction with respect to the substrate 10).

The third sealing layer SE3 entirely covers the first resin layer RS1. Further, the third sealing layer SE3 is in contact with, of the second sealing layer SE2, the portion which covers the dam structure DS. In this configuration, the end portion RS1*a* of the first resin layer RS1 is covered with the second sealing layer SE2 and the third sealing layer SE3. The position of an end portion SE3*a* of the third sealing layer SE3 is substantially coincident with that of the end portion SE2*a* of the second sealing layer SE2.

The second resin layer RS2 entirely covers the third sealing layer SE3. The position of an end portion RS2*a* of the second resin layer RS2 is substantially coincident with that of the end portion SE3*a* of the third sealing layer SE3. Thus, in the example of FIG. 8, the positions of the end portion SE2*a*, the end portion SE3*a* and the end portion RS2*a* are aligned with each other.

Figure 9:
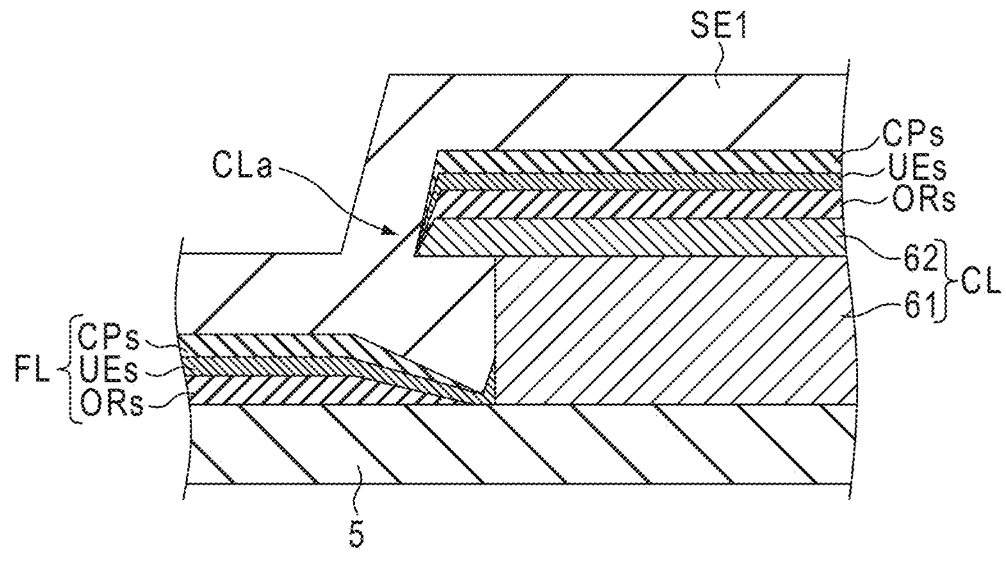
FIG. 9 is a schematic cross-sectional view of the vicinity of an end portion of the conductive layer shown in FIG. 8.

FIG. 9 is a schematic cross-sectional view near the end portion CLa of the conductive layer CL. The conductive layer CL comprises the lower portion 61 and the upper portion 62 in a manner similar to that of the partition 6 shown in FIG. 4.

In the end portion CLa, the upper portion 62 protrudes relative to a side surface of the lower portion 61. In other words, the shape of the conductive layer CL in the end portion CLa is an overhang shape in a manner similar to that of the partition 6.

When the thin film FL (the organic layer ORs, the upper electrode UEs and the cap layer CPs) is formed on the conductive layer CL having this shape, as shown in FIG. 9, the thin film FL is divided in the end portion CLa. The first sealing layer SE1 covers the organic layer ORs, upper electrode UEs and cap layer CPs located on and under the conductive layer CL and also covers a side surface of the lower portion 61.

In FIG. 7 and FIG. 8, this specification focuses attention on the structure between the display area DA and the end portion 10*a* of the substrate 10. However, a similar structure can be applied to the structure between the display area DA and the end portion 10*b*, the structure between the display area DA and the end portion 10*c* and the structure between the display area DA and the end portion 10*d*.

Now, this specification explains the manufacturing method of the display device DSP.

FIG. 10 to FIG. 15 are schematic cross-sectional views showing part of the manufacturing process of the display device DSP. To manufacture the display device DSP, first, the circuit layer 11 including the pixel circuit 1, the gate drive circuits CD1 and CD2, the selector circuit ST and the feed line PW is formed on the substrate 10. After the formation of the circuit layer 11, the second organic insulating layer 12 is formed on the circuit layer 11.

Figure 10:
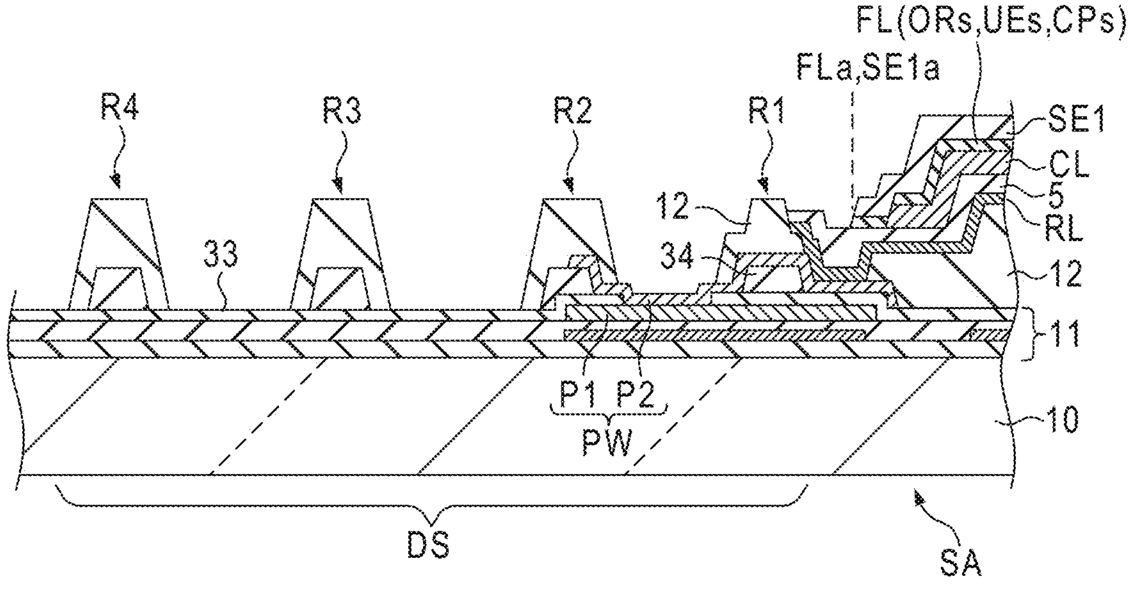
FIG. 10 is a schematic cross-sectional view showing part of the manufacturing process of the display device according to the first embodiment.

When the second organic insulating layer 12 and the first organic insulating layer 34 of the circuit layer 11 are formed, these organic insulating layers 12 and 34 are patterned, and the dam structure DS including the protrusions R1, R2, R3 and R4 is formed in the surrounding area SA as shown in FIG. 10.

Subsequently, the lower electrodes LE1, LW2 and LE3 shown in FIG. 3 and the relay line RL shown in FIG. 8 are formed. On these elements, the rib 5 is formed. Further, the partition 6 and the conductive layer CL are formed.

Subsequently, the thin film FL1 including the organic layer OR1, the upper electrode UE1 and the cap layer CP1 and the first sealing layer SE11 are formed in subpixel SP1. The thin film FL2 including the organic layer OR2, the upper electrode UE2 and the cap layer CP2 and the first sealing layer SE12 are formed in subpixel SP2. The thin film FL3 including the organic layer OR3, the upper electrode UE3 and the cap layer CP3 and the first sealing layer SE13 are formed in subpixel SP3. Although the formation order of the thin films FL1, FL2 and FL3 is not particularly limited, for example, the thin film FL3 is formed firstly, and the thin film FL2 is formed secondly, and the thin film FL1 is formed lastly.

For example, the thin film FL (the organic layer ORs, the upper electrode UEs and the cap layer CPs) and first sealing layer SE1 shown in FIG. 10 are formed of the same materials by the same processes as the thin film FL1 and first sealing layer SE11 formed lastly. The thin film FL1 and the first sealing layer SE1 are patterned by dry etching or wet etching using the same mask. Thus, as shown in FIG. 10, the end portion FLa of the thin film FL is aligned with the end portion SE1*a* of the first sealing layer SE1.

The layers (the organic layer, upper electrode and cap layer) constituting the thin films FL, FL1, FL2 and FL3 are formed by vapor deposition. The first sealing layers SE1, SE11, SE12 and SE13 are formed by, for example, chemical vapor deposition (CVD).

Figure 11:
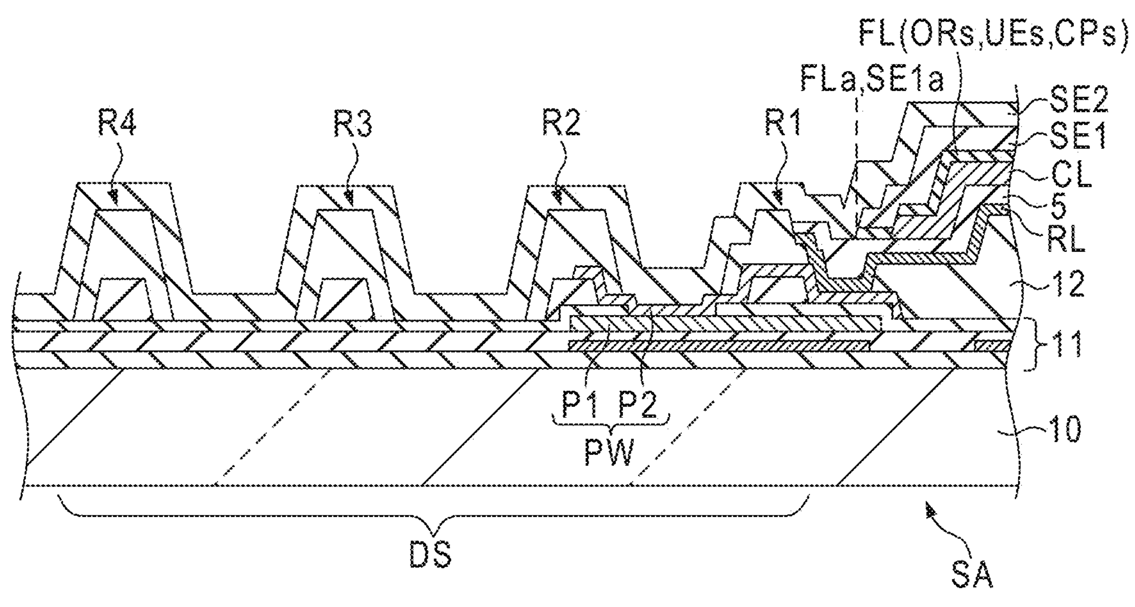
FIG. 11 is a schematic cross-sectional view showing a manufacturing process following FIG. 10.

After the formation of the thin film FL and the first sealing layer SE1, as shown in FIG. 11, the second sealing layer SE2 which covers the end portion FLa of the thin film FL is formed. At this point, the second sealing layer SE2 is formed in the entire substrate 10 and covers all of the protrusions R1, R2, R3 and R4 of the dam structure DS.

Figure 12:
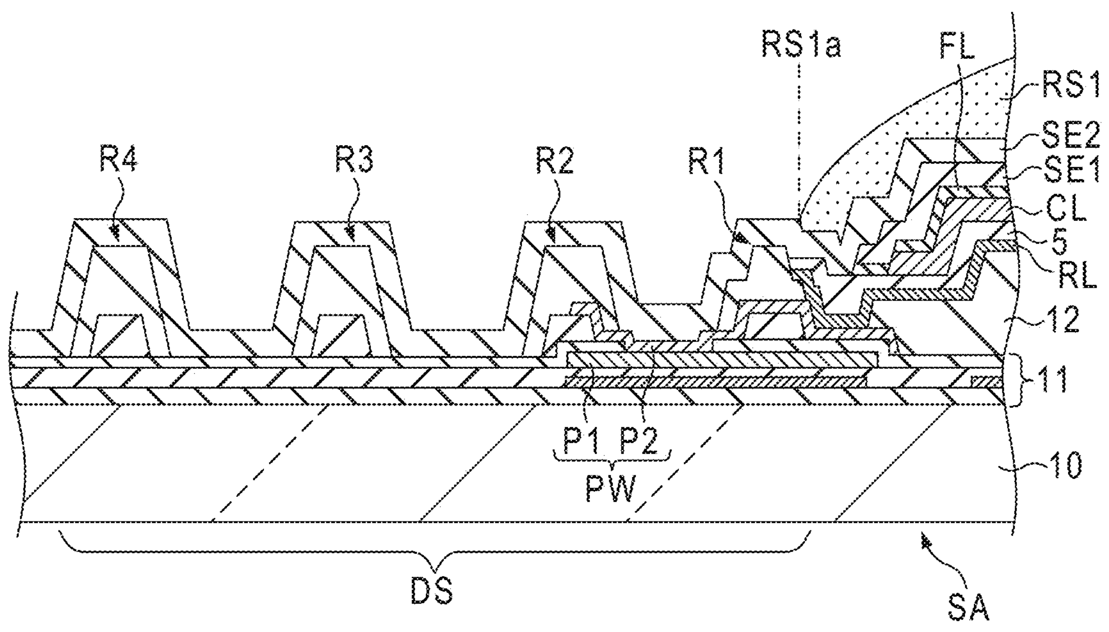
FIG. 12 is a schematic cross-sectional view showing a manufacturing process following FIG. 11.

After the formation of the second sealing layer SE2, as shown in FIG. 12, the first resin layer RS1 is formed. The first resin layer RS1 is formed by, for example, an ink-jet method. The projections and depressions generated in the second sealing layer SE2 by the protrusions R1, R2, R3 and R4 prevent the expansion of the first resin layer RS1 before it is cured. In FIG. 12, the end portion RS1*a* of the first resin layer RS1 is dammed up by the protrusion R1.

After the formation of the first resin layer RS1, as shown in FIG. 13, the third sealing layer SE3 which covers the first resin layer RS1 is formed. At this point, the third sealing layer SE3 is formed in the entire substrate 10 and also covers the second sealing layer SE2 exposed from the first resin layer RS1.

After the formation of the third sealing layer SE3, as shown in FIG. 14, the second resin layer RS2 is formed. The second resin layer RS2 is formed by, for example, an ink-jet method in a manner similar to that of the first resin layer RS1. The projections and depressions generated in the third sealing layer SE3 by the protrusions R1, R2, R3 and R4 prevent the expansion of the second resin layer RS2 before it is cured. In FIG. 14, the end portion RS2*a* of the second resin layer RS2 is dammed up by the protrusion R3.

Figure 15:
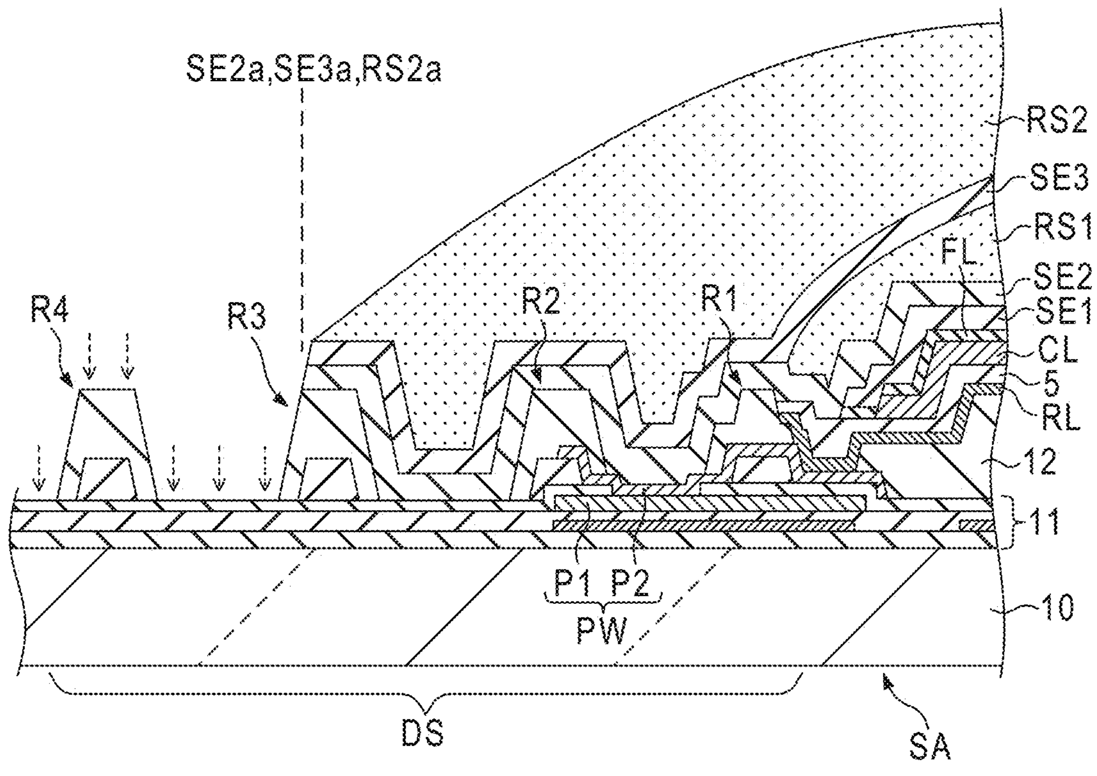
FIG. 15 is a schematic cross-sectional view showing a manufacturing process following FIG. 14.

Subsequently, as shown in FIG. 15, of the second sealing layer SE2 and the third sealing layer SE3, the portions exposed from the second resin layer RS2 are removed by etching. In this way, the display device DSP comprising the structure shown in FIG. 8 can be obtained. This etching is, for example, dry etching, and uses the second resin layer RS2 as a mask.

By this etching, the end portion SE2*a* of the second sealing layer SE2 and the end portion SE3*a* of the third sealing layer SE3 are aligned with the end portion RS2*a* of the second resin layer RS2. Before the etching, as shown in FIG. 14, all of the protrusions R1, R2, R3 and R4 are covered with the second sealing layer SE2 and the third sealing layer SE3. However, after the etching, as shown in FIG. 15, part of the protrusion R3 and the protrusion R4 are exposed from the second sealing layer SE2 and the third sealing layer SE3.

In the embodiment described above, the end portion FLa of the thin film FL provided in the surrounding area SA is located between the dam structure DS and the display area DA. Further, the second sealing layer SE2 covers the end portion FLa and directly covers the dam structure DS (protrusions R1, R2, R3 and R4).

As the thin film FL is formed by vapor deposition, there is a possibility that the thin film FL does not exert a good adherence to the base. Therefore, if the thin film FL extends to the dam structure DS, the adhesion strength of the peripheral portion of the display device DSP could be reduced. Moreover, if the thin film FL extends to the dam structure DS, moisture may enter the display device DSP through the end portion FLa of the thin film FL. If this moisture reaches the gate drive circuit GD1 or GD2, the selector circuit ST, the feed line PW, the pixel circuit 1, the display element DE1, DE2 or DE3, etc., an operation failure could occur in the display device DSP.

To the contrary, in the present embodiment, as the thin film FL does not extend to the dam structure DS, the second sealing layer SE2 is in contact with the dam structure DS. The second sealing layer SE2 is formed by, for example, CVD, and has an excellent adherence to the base compared to the thin film FL formed by vapor deposition. Thus, the adhesion strength of the peripheral portion of the display device DSP is improved. In the present embodiment, as the end portion FLa of the thin film FL is covered with the second sealing layer SE2, moisture penetration through the thin film FL can be prevented. In this way, according to the configuration of the display device DSP of the present embodiment, the reliability of the display device DSP can be improved.

As shown in FIG. 4, the second sealing layer SE2 covers the end portions of the thin films FL1, FL2 and FL3 and the partition 6 in the display area DA as well. This structure can further satisfactorily prevent moisture from entering the display elements DE1, DE2 and DE3 and the pixel circuit 1.

In the present embodiment, the third sealing layer SE3 is provided on the first resin layer RS1, and the end portion RS1*a* of the first resin layer RS1 is covered with the second sealing layer SE2 and the third sealing layer SE3. In this configuration, the first resin layer RS1 is covered with the second and third sealing layers SE2 and SE3 each of which is entirely formed of an inorganic material, thereby preventing moisture from entering the first resin layer RS1. Further, the third sealing layer SE3 is in contact with, of the second sealing layer SE2, the portion which covers the dam structure DS. As the third sealing layer SE3 is formed by, for example, CVD, the third sealing layer SE3 has an excellent adherence to the second sealing layer SE2. By this configuration, the adhesion strength of the peripheral portion of the display device DSP is further improved.

In the present embodiment, the third sealing layer SE3 is covered with the second resin layer RS2. By this configuration, the third sealing layer SE3 formed of an inorganic material is protected. Further, the upper surface of the display device DSP can be planarized.

Moreover, in the manufacturing method of the display device DSP of the present embodiment, the second sealing layer SE2 and the third sealing layer SE3 are partly removed by using the second resin layer RS2 as a mask. By this configuration, the number of manufacturing processes of the display device DSP can be reduced compared to a case where a mask for etching is formed by a resist.

In the configuration of the example shown in FIG. 8, the first resin layer RS1 is dammed up by the protrusion R1, and the second resin layer RS2 is dammed up by the protrusion R3. However, as shown in the following FIG. 16 and FIG. 17, the position of the end portion RS1*a* of the first resin layer RS1 or the position of the end portion RS2*a* of the second resin layer RS2 is not limited to the example of FIG. 8.

Figure 16:
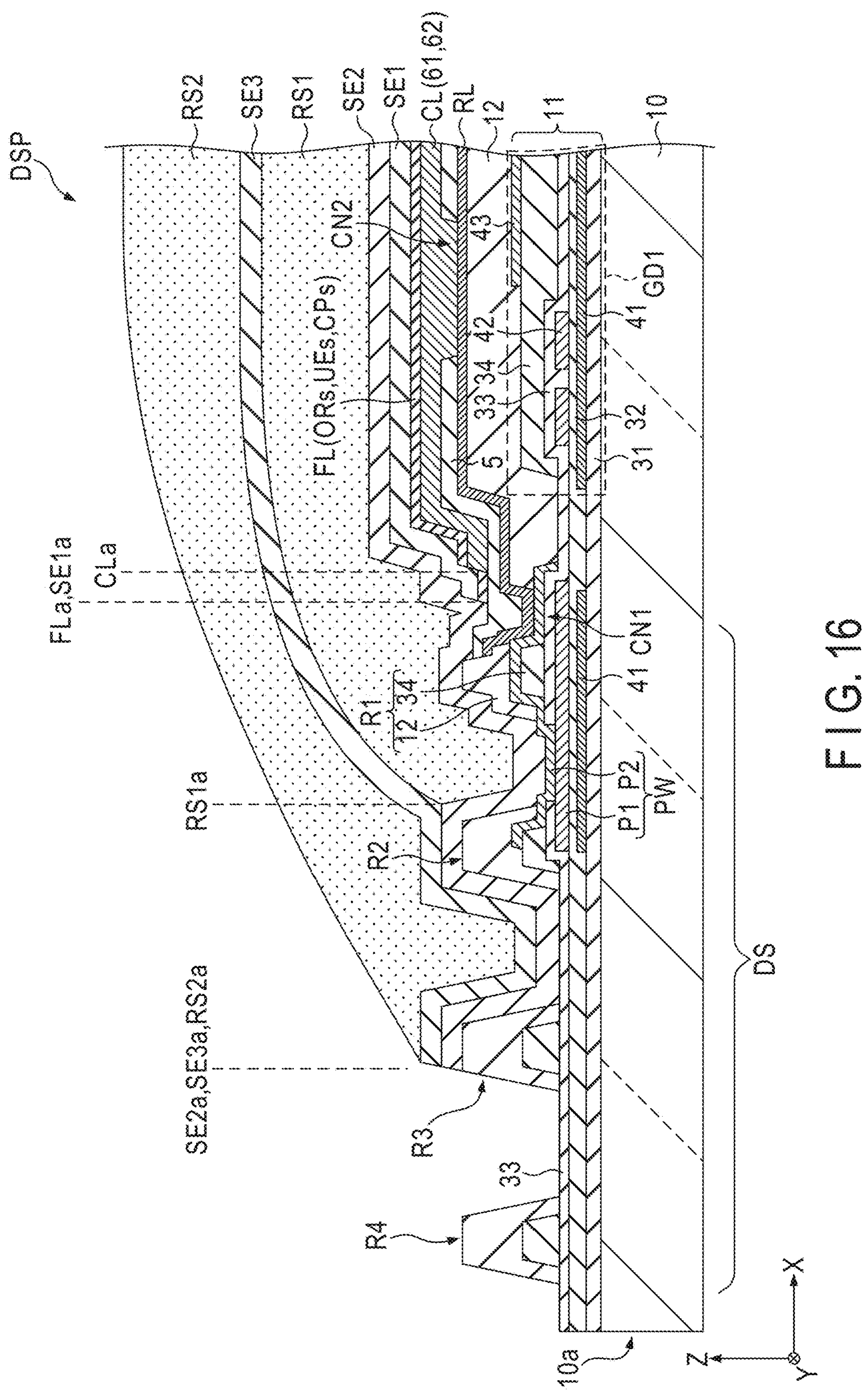
FIG. 16 is a schematic cross-sectional view showing a first modified example which could be applied to the display device according to the first embodiment.

FIG. 16 is a schematic cross-sectional view showing a first modified example which could be applied to the display device DSP according to the first embodiment. In the example of FIG. 16, the first resin layer RS1 reaches the protrusion R2 beyond the protrusion R1. The end portion RS1*a* of the first resin layer RS1 is located near the protrusion R2.

FIG. 17 is a schematic cross-sectional view showing a second modified example which could be applied to the display device DSP according to the first embodiment. In the example of FIG. 17, the second resin layer RS2 reaches the protrusion R4 beyond the protrusion R3. The end portion RS2*a* of the second resin layer RS2 is located near the protrusion R4.

The display device DSP may not necessarily comprise one of the structures of FIG. 8, FIG. 16 and FIG. 17 over the entire surrounding area SA. For example, the display device DSP may comprise a portion comprising the structure of one of FIG. 8, FIG. 16 and FIG. 17, and a portion comprising the structure of another one of FIG. 8, FIG. 16 and FIG. 17.

Second Embodiment

A second embodiment is explained. The configurations which are not particularly referred to are the same as those of the first embodiment.

Figure 18:
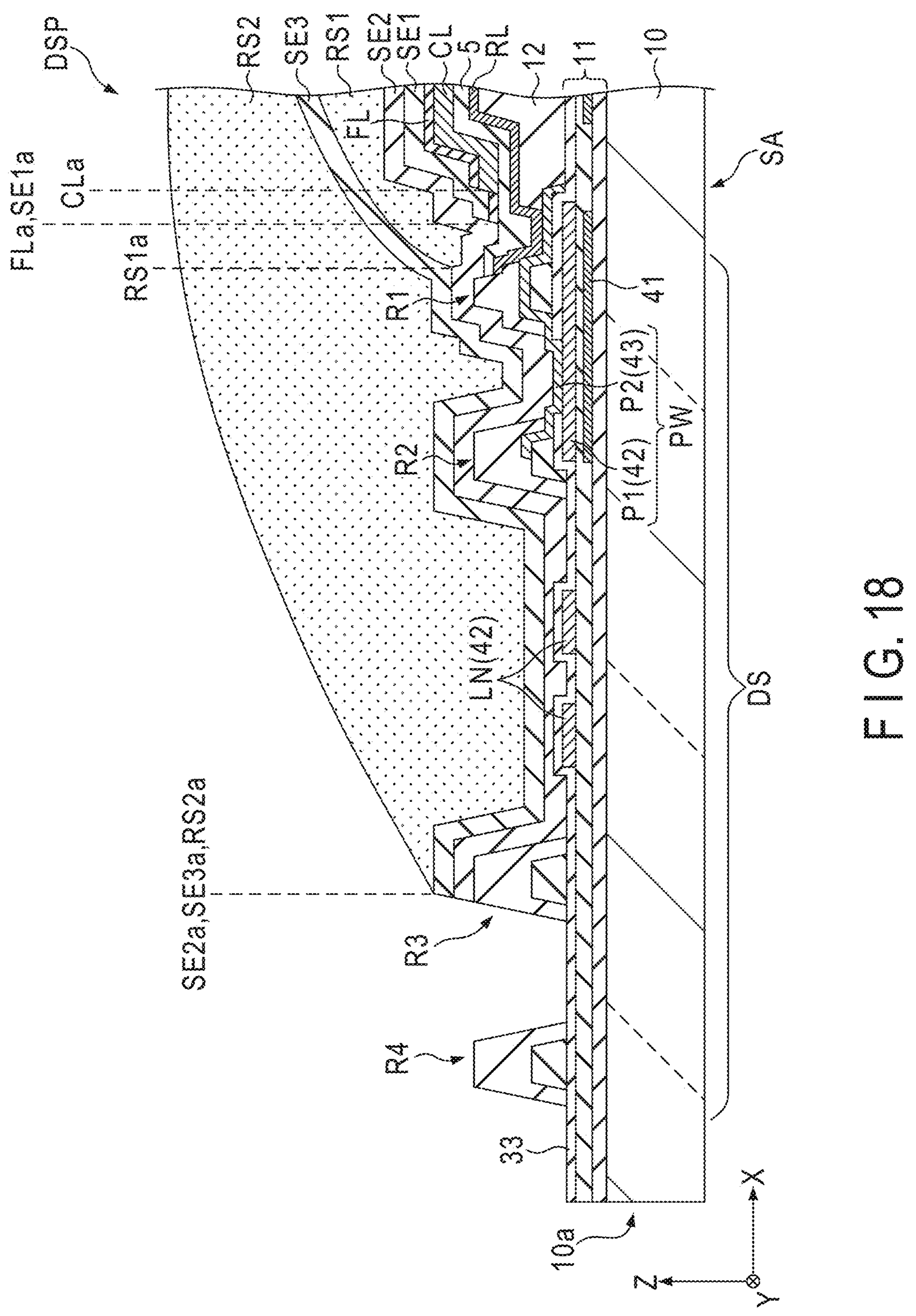
FIG. 18 is a schematic cross-sectional view of a display device according to a second embodiment.

FIG. 18 is a schematic cross-sectional view of a display device DSP according to the second embodiment. In the present embodiment, the display device DSP comprises lines LN provided in a dam structure DS.

In the example of FIG. 18, two lines LN are provided between protrusions R2 and R3. For example, one of the lines LN is a power line which applies high power supply voltage (Pvdd) to each portion of the display device DSP. The other one is a power line which applies low power supply voltage (Pvss) to each portion. It should be noted that the type of the lines LN is not limited to power lines. In addition, the number of lines LN is not limited to two.

Each line LN is formed of, for example, a metal layer 42, and is covered with an inorganic insulating layer 33, a second sealing layer SE2, a third sealing layer SE3 and a second resin layer RS2. Each line LN may be formed of a metal layer 41 or may be formed of a metal layer 43. Each line LN may comprise a multilayer structure including at least two of the metal layers 41, 42 and 43.

In FIG. 18, a first resin layer RS1 is dammed up by a protrusion R1, and the second resin layer RS2 is dammed up by the protrusion R3. However, the position of an end portion RS1*a* of the first resin layer RS1 or the position of an end portion RS2*a* of the second resin layer RS2 is not limited to the example of FIG. 18.

Figure 19:
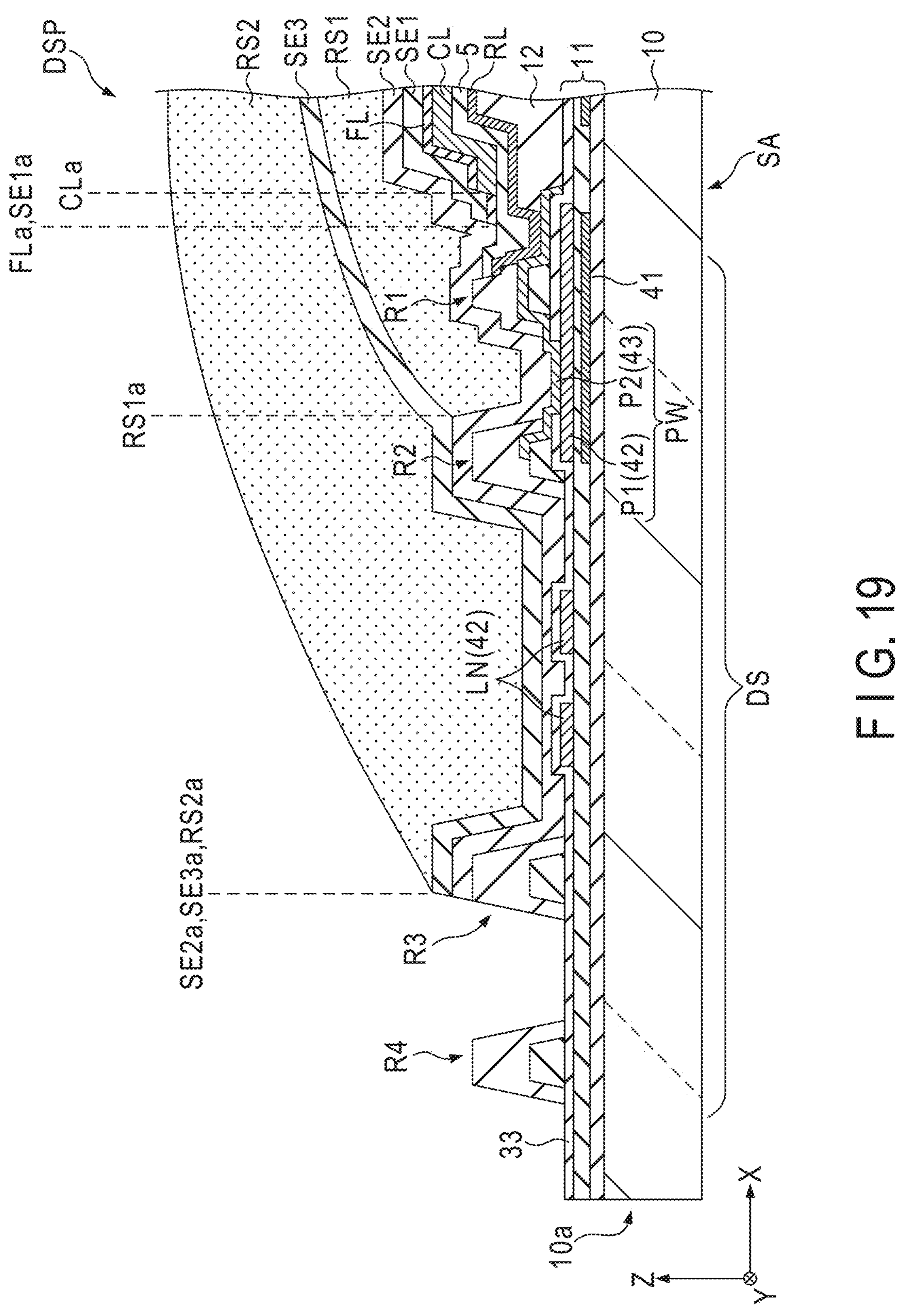
FIG. 19 is a schematic cross-sectional view showing a first modified example which could be applied to the display device according to the second embodiment.

FIG. 19 is a schematic cross-sectional view showing a first modified example which could be applied to the display device DSP according to the second embodiment. In the example of FIG. 19, the first resin layer RS1 reaches the protrusion R2 beyond the protrusion R1. The end portion RS1*a* of the first resin layer RS1 is located near the protrusion R2.

FIG. 20 is a schematic cross-sectional view showing a second modified example which could be applied to the display device DSP according to the second embodiment. In the example of FIG. 20, the second resin layer RS2 reaches a protrusion R4 beyond the protrusion R3. The end portion RS2*a* of the second resin layer RS2 is located near the protrusion R4. In the configuration of FIG. 20, at least one of the plurality of lines LN may be provided between the protrusions R3 and R4.

The dam structure DS can be effectively used by providing the lines LN in the dam structure DS like the present embodiment. In this configuration, a surrounding area SA can be made small compared to a case where the lines LN are provided at positions which do not overlap the dam structure DS.

Third Embodiment

A third embodiment is explained. The configurations which are not particularly referred to are the same as those of the first embodiment.

Figure 22:
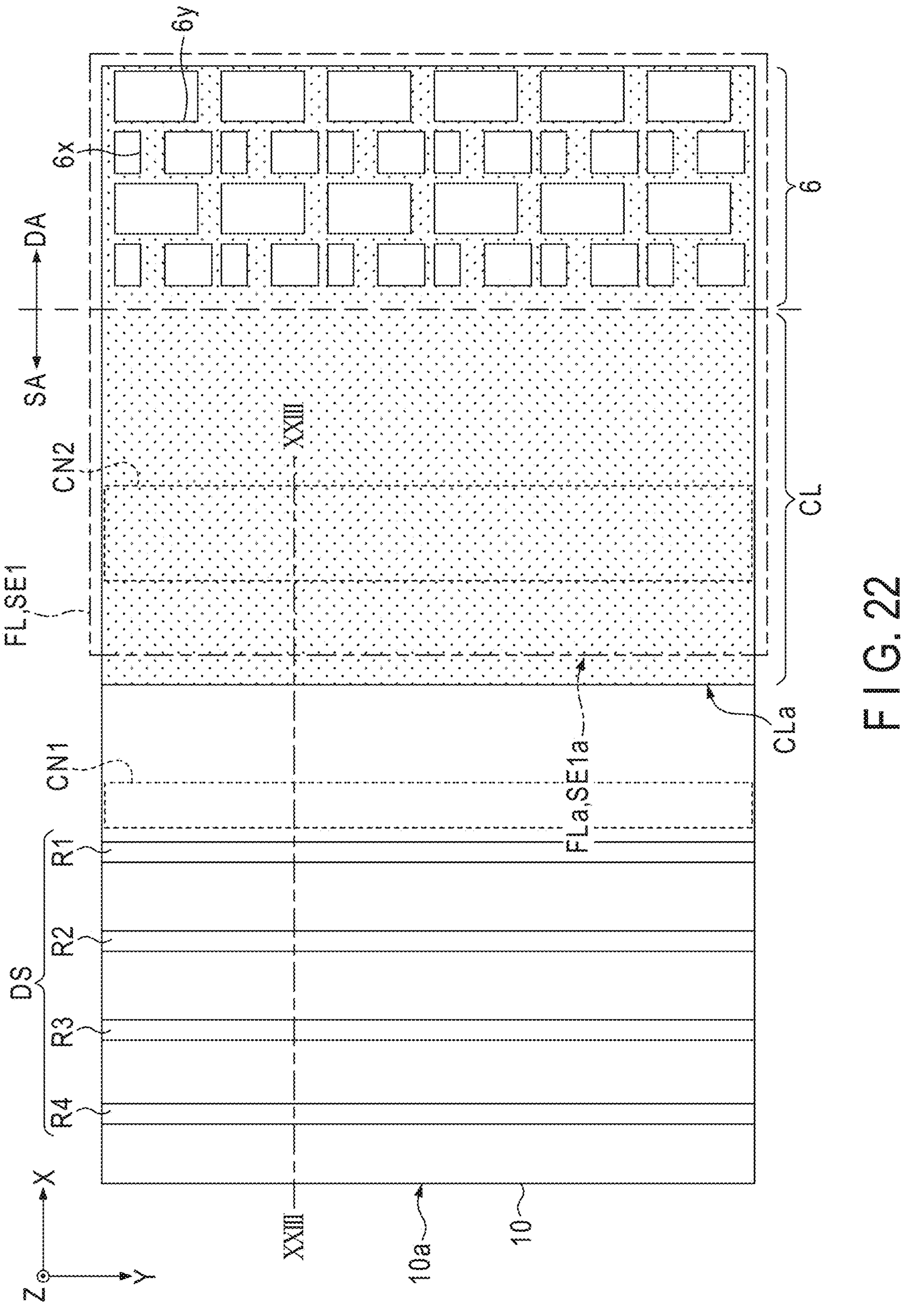
FIG. 22 is an enlarged view of the area surrounded by the chained frame XXII in FIG. 21.
Figure 23:
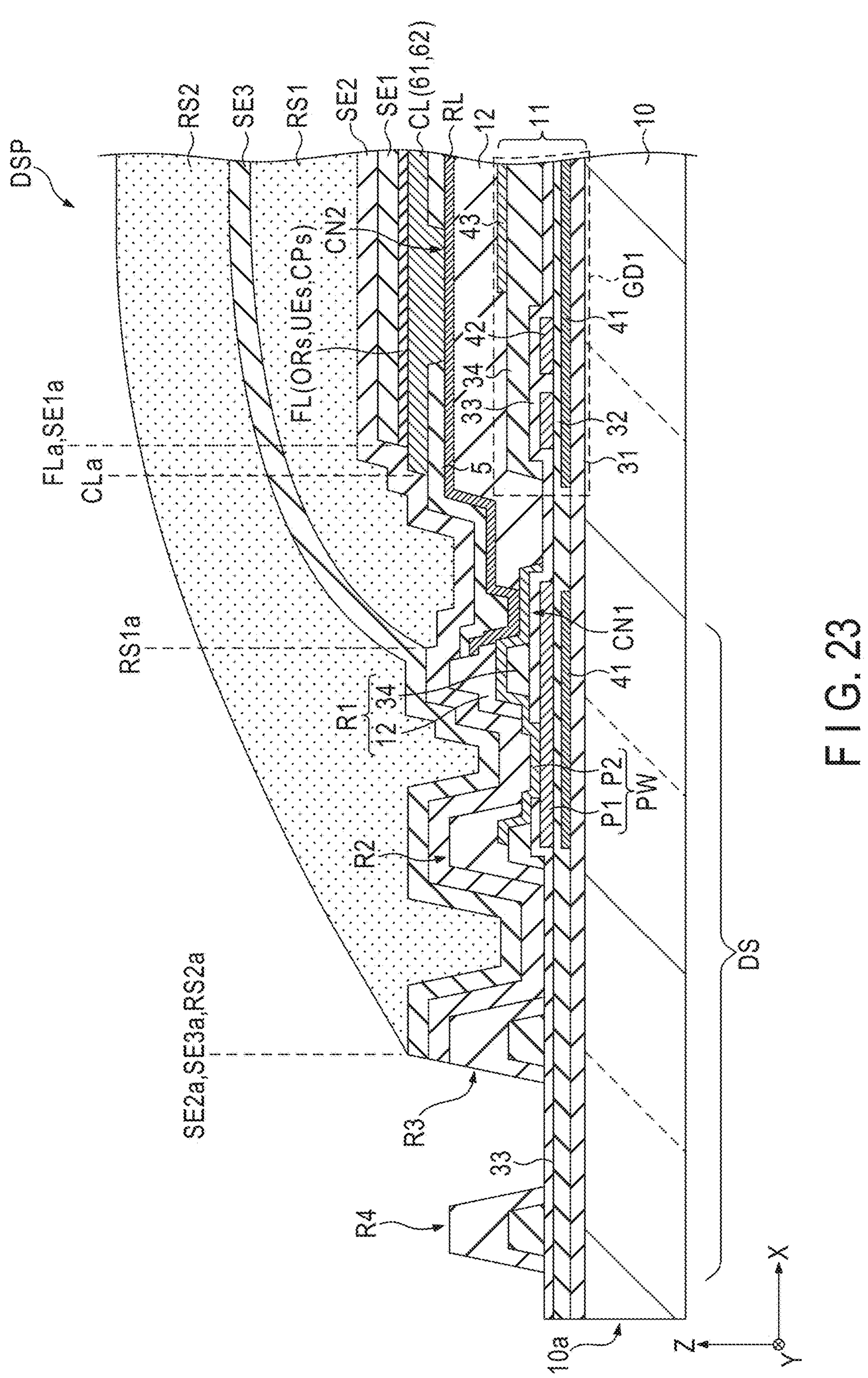
FIG. 23 is a schematic cross-sectional view of the display device along the XXIII-XXIII line of FIG. 22.

FIG. 21 is a schematic plan view of a display device DSP according to the third embodiment. FIG. 22 is an enlarged view of the area surrounded by the chained frame XXII in FIG. 21. FIG. 23 is a schematic cross-sectional view of the display device DSP along the XXIII-XXIII line of FIG. 22.

As shown in FIG. 21, in the present embodiment, an end portion FLa of a thin film FL (an organic layer ORs, an upper electrode UEs and a cap layer CPs) and an end portion SE1*a* of a first sealing layer SE1 overlap a conductive layer CL as seen in plan view. In other words, the end portions FLa and SE1*a* are located between an end portion CLa of the conductive layer CL and a display area DA. In the example of FIG. 21, the end portions FLa and SE1*a* overlap the conductive layer CL over the whole circumference. However, a portion in which the end portion FLa or SE1*a* does not overlap the conductive layer CL may be present.

As shown in FIG. 22, the end portions FLa and SE1*a* are located between the end portion CLa of the conductive layer CL and a second contact portion CN2. The end portions FLa and SE1*a* may be located between the second contact portion CN2 and the display area DA.

As shown in FIG. 23, the end portions FLa and SE1*a* are located on the conductive layer CL. In a manner similar to that of each embodiment described above, the end portions FLa and SE1*a* are located below a first resin layer RS1 and is covered with a second sealing layer SE2.

In the example of FIG. 23, an end portion RS1*a* of the first resin layer RS1 is dammed up by a protrusion R1, and an end portion RS2*a* of a second resin layer RS2 is dammed up by a protrusion R3. The end portion RS1*a* may be dammed up by a protrusion R2 in a manner similar to that of the example of FIG. 16. The end portion RS2*a* may be dammed up by a protrusion R4 in a manner similar to that of the example of FIG. 17. The lines LN shown in FIG. 18 may be provided in a dam structure DS.

Effects similar to those of the above embodiments can be also obtained from the configuration of the present embodiment. In addition, in the present embodiment, the second sealing layer SE2 is in contact with a rib 5 as a whole in the area between the conductive layer CL and the dam structure DS. By this configuration, the adherence between the second sealing layer SE2 and the rib 5 can be enhanced.

All of the display devices and manufacturing methods thereof that can be implemented by a person of ordinary skill in the art through arbitrary design changes to the display device and manufacturing method thereof described above as the embodiments of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiments by adding or deleting a structural element or changing the design of a structural element, or adding or omitting a step or changing the condition of a step, all of the modifications fall within the scope of the present invention as long as they are in keeping with the spirit of the invention.

Further, other effects which may be obtained from each embodiment and are self-explanatory from the descriptions of the specification or can be arbitrarily conceived by a person of ordinary skill in the art are considered as the effects of the present invention as a matter of course.

What is claimed is:

1. A display device comprising:

a substrate;

a lower electrode provided above the substrate in a display area including a pixel;

a rib comprising an aperture overlapping the lower electrode;

a partition provided on the rib in the display area;

a thin film including an upper electrode which faces the lower electrode, and an organic layer which emits light based on a potential difference between the lower electrode and the upper electrode;

a first sealing layer formed of an inorganic material and covering the thin film and the partition;

a second sealing layer formed of an inorganic material and provided on the first sealing layer;

a first resin layer provided on the second sealing layer;

a third sealing layer formed of an inorganic material and provided on the first resin laver;

a second resin layer provided on the third sealing layer; and a dam structure including a plurality of protrusions provided in a surrounding area between an end portion of the substrate and the display area, wherein the thin film is provided in the display area and the surrounding area, an end portion of the thin film in the surrounding area is located between the dam structure and the display area, the second sealing layer covers the end portion of the thin film and covers at least part of the dam structure, the end portion of the thin film overlaps the first resin layer in a thickness direction of the substrate, an end portion of the first resin layer is covered with the second sealing layer and the third sealing laver, and positions of end portions of the second sealing layer, the third sealing layer and the second resin layer are aligned with each other.

2. The display device of claim 1, wherein the third sealing layer is in contact with, of the second sealing layer, a portion which covers the dam structure.

3. The display device of claim 1, wherein the dam structure surrounds the display area.

4. A display device comprising:

a substrate;

a lower electrode provided above the substrate in a display area including a pixel;

a rib comprising an aperture overlapping the lower electrode;

a partition provided on the rib in the display area;

a thin film including an upper electrode which faces the lower electrode, and an organic layer which emits light based on a potential difference between the lower electrode and the upper electrode;

a first sealing layer formed of an inorganic material and covering the thin film and the partition;

a second sealing layer formed of an inorganic material and provided on the first sealing layer;

a dam structure including a plurality of protrusions provided in a surrounding area between an end portion of the substrate and the display area; and a conductive layer provided in the surrounding area and covered with the thin film, wherein the thin film is provided in the display area and the surrounding area, an end portion of the thin film in the surrounding area is located between the dam structure and the display area, the second sealing layer covers the end portion of the thin film and covers at least part of the dam structure, and each of the partition and the conductive layer comprises a conductive lower portion and an upper portion protruding from a side surface of the lower portion.

5. The display device of claim 4, wherein the end portion of the thin film is located between an end portion of the conductive layer and the dam structure, and the thin film is divided by the end portion of the conductive layer.

6. The display device of claim 4, wherein the end portion of the thin film is located between an end portion of the conductive layer and the display area.

7. The display device of claim 4, further comprising a feed line provided in the surrounding area, wherein the conductive layer is electrically connected to the feed line and the partition.

8. The display device of claim 7, wherein the upper electrode is in contact with the partition, and the feed line applies common voltage to the upper electrode via the conductive layer and the partition.

9. The display device of claim 8, wherein the protrusion includes a first organic insulating layer and a second organic insulating layer which covers the first organic insulating layer.

10. The display device of claim 9, wherein the feed line includes a first portion and a second portion each formed of a metal material, and the first organic insulating layer is located between the first portion and the second portion in a thickness direction of the substrate.

11. The display device of claim 1, further comprising a line provided between two adjacent protrusions of the plurality of protrusions, and the line is covered with the second sealing layer.

* * * * *